US011176295B1

(12) United States Patent
Ershov

(10) Patent No.: US 11,176,295 B1
(45) Date of Patent: Nov. 16, 2021

(54) MATCHED NET AND DEVICE ANALYSIS BASED ON PARASITICS

(71) Applicant: Diakopto, Inc., San Jose, CA (US)

(72) Inventor: Maxim Ershov, San Jose, CA (US)

(73) Assignee: Diakopto, Inc., San Jose, CA (US)

( * ) Notice: Subject to any disclaimer, the term of this patent is extended or adjusted under 35 U.S.C. 154(b) by 0 days.

(21) Appl. No.: 16/935,296

(22) Filed: Jul. 22, 2020

Related U.S. Application Data

(63) Continuation of application No. 16/434,454, filed on Jun. 7, 2019, now Pat. No. 10,783,296, which is a continuation-in-part of application No. 16/429,007, filed on Jun. 2, 2019, now Pat. No. 10,762,259.

(60) Provisional application No. 62/682,748, filed on Jun. 8, 2018, provisional application No. 62/682,743, filed on Jun. 8, 2018.

(51) Int. Cl.
*G06F 30/327* (2020.01)

(52) U.S. Cl.
CPC ................... *G06F 30/327* (2020.01)

(58) Field of Classification Search
CPC .................................................. G06F 30/327
USPC ........................................................ 716/104
See application file for complete search history.

(56) References Cited

U.S. PATENT DOCUMENTS

| | | | |
|---|---|---|---|
| 5,767,542 A | 6/1998 | Nakamura | |
| 6,381,730 B1 | 4/2002 | Chang | |
| 6,591,402 B1 | 7/2003 | Chandra | |
| 6,956,424 B2 | 10/2005 | Hohnel | |
| 7,669,152 B1 | 2/2010 | Tcherniav | |
| 7,756,472 B2 | 7/2010 | Darabi | |
| 7,882,471 B1 | 2/2011 | Kariat | |
| 7,882,484 B1 * | 2/2011 | Baldwin | G06F 30/30 716/115 |
| 8,099,699 B2 | 1/2012 | Charlet | |
| 8,146,032 B2 | 3/2012 | Chen | |
| 8,195,439 B1 | 6/2012 | Hussain | |
| 8,261,228 B1 | 9/2012 | Gopalakrishnan | |
| 8,312,406 B2 | 11/2012 | Song | |

(Continued)

FOREIGN PATENT DOCUMENTS

CN 109948263 A 6/2019

OTHER PUBLICATIONS

"Sensitivity analysis in linear systems", A. Deif, Springer-Verlag, 1986, 234 pages.

(Continued)

*Primary Examiner* — Suchin Parihar
(74) *Attorney, Agent, or Firm* — Marc P. Schuyler

(57) ABSTRACT

A computer/software tool for electronic design automation (EDA) extracts parasitics from a post-layout netlist file for an integrated circuit (IC) design and uses these parasitics to model circuit behavior specifically to assess matching of reciprocal objects of a matched circuit. The computer/software tool generates a visual display based on the calculated design characteristics; for example, in one embodiment, asymmetry can be color-coded to permit a designer to visualize sources of matching problems base on mismatched parasitics. In other embodiments, the parasitics, structural elements and/or results can be filtered and/or processed, e.g., so as to provide EDA driven assistance to reduce excessive sensitivity to certain parasitics, and to minimize net and device systematic (layout-based) mismatch.

26 Claims, 8 Drawing Sheets
(2 of 8 Drawing Sheet(s) Filed in Color)

(56) References Cited

U.S. PATENT DOCUMENTS

| | | | |
|---|---|---|---|
| 8,407,646 | B2 | 3/2013 | Chandramohan |
| 8,453,102 | B1 | 5/2013 | Pack |
| 8,656,331 | B1 | 2/2014 | Sundareswaran |
| 8,700,377 | B2 | 4/2014 | Bolcato |
| 8,799,839 | B1 | 8/2014 | Tetelbaum |
| 8,856,720 | B2 | 10/2014 | Yeh |
| 8,954,917 | B1 | 2/2015 | Shu |
| 9,141,740 | B2 | 9/2015 | Liu |
| 9,147,034 | B1 | 9/2015 | Hawkins |
| 10,372,870 | B2* | 8/2019 | Koranne ............... G06F 30/39 |
| 10,762,259 | B1 | 9/2020 | Ershov |
| 10,783,296 | B1 | 9/2020 | Ershov |
| 2002/0118130 | A1* | 8/2002 | Kulkarni ............... G06F 30/39 341/172 |
| 2004/0049747 | A1* | 3/2004 | Yamasaki ............ G06F 30/398 716/107 |
| 2004/0158805 | A1* | 8/2004 | Kanamoto ........... G06F 30/367 716/115 |
| 2005/0204318 | A1 | 9/2005 | Iadanza |
| 2007/0050745 | A1 | 3/2007 | Dinter |
| 2012/0022846 | A1* | 1/2012 | White .................. G06F 30/398 703/14 |
| 2013/0346931 | A1 | 12/2013 | Murakawa |
| 2014/0282308 | A1 | 9/2014 | Chen |
| 2014/0304670 | A1 | 10/2014 | Su |
| 2015/0331981 | A1 | 11/2015 | Mulvaney |
| 2016/0079994 | A1 | 3/2016 | Lee |
| 2016/0125115 | A1 | 5/2016 | Strang |
| 2018/0068036 | A1 | 3/2018 | Oriordan |
| 2019/0034574 | A1 | 1/2019 | Zhu |
| 2019/0220552 | A1 | 7/2019 | Koranne |

OTHER PUBLICATIONS

"Circuit Sensitivity to Interconnect Variation", Z. Lin, C. J. Spanos, L. S. Milor, and Y. T. Lin, IEE Transactions on Semiconductor Manufacturing, v. 11. No. 4, Nov. 1998, pp. 557-568.
"Minimizing Component-Variation Sensitivity in Single Op Amp Filters", Application Note 738, Maxim Integrated, Jul. 22, 2002, 18 pages.
"On the analysis of sensitivity to parasitic effects", G.S.Moschytz, IEE Journal on Electronic Circuits and Systems, vol. 3, No. 5, Sep. 1979, pp. 233-239.
"Large Change Response Sensitivity of Linear Networks", Haley, IEEE Transactions on Circuits and Systems, vol. 27, No. 4, Apr. 1980, pp. 305-310.
"The Generalized Adjoint Network and Network Sensitivities", S. Director and R. Rohrer, IEEE Transactions on Circuit Theory, vol. 16, No. 3, Aug. 1969, pp. 318-323.
"Incremental Versus Adjoint Models for Network Sensitivity Analysis", L. Vallese, IEEE Transactions on Circuits and Systems, vol. 21, No. 1, Jan. 1974, pp. 46-49.
"Computation of Sensitivities for Noncommensurate Networks", J. Bandler and R. Seviora, IEEE Transactions on Circuit Theory, vol. 18, No. 1, Jan. 1971, pp. 174-178.
"Sensitivity assessment of parasitic effects in second-order active-filter configurations", J.K. Fidler, IEE Journal on Electronic Circuits and Systems, vol. 2 , No. 6, Nov. 1978, pp. 181-185.
"Sensitivity: Old Questions, Some New Answers ", S. R. Parker, IEEE Transactions on Circuit Theory, vol. 18, No. 1, Jan. 1971, pp. 27-35.
M. J. McNutt, S. LeMarquis and J. L. Dunkley, "Systematic capacitance matching errors and corrective layout procedures," IEEE Journal of Solid-State Circuits, vol. 29, No. 5, May 1994, pp. 611-616.
"A fully differential layout placement paradox: Matching vs. full symmetry," H. Binici and J. Kostamovaara, 2008 15th IEEE International Conference on Electronics, Circuits and Systems, St. Julien's, Apr. 2008, pp. 344-347.
"Experimental investigation of the minimum signal for reliable operation of DRAM sense amplifiers," H. Geib, W. Weber, E. Wohlrab and L. Risch, IEEE Journal of Solid-State Circuits, vol. 27, No. 7, pp. 1028-1035, Jul. 1992.
"Mismatch sensitivity of a simultaneously latched CMOS sense amplifier," R. Sarpeshkar, J. L. Wyatt, N. C. Lu and P. D. Gerber, IEEE Journal of Solid-State Circuits, vol. 26, No. 10, pp. 1413-1422, Oct. 1991.
"A Self-Biased Charge-Transfer Sense Amplifier," S. Patil, M. Wieckowski and M. Margala, 2007 IEEE International Symposium on Circuits and Systems, New Orleans, LA, Jul. 2007, pp. 3030-3033.
"Stray-insensitive switched-capacitor sample-delay-hold buffers for video frequency applications," J. J. F. Rijns and H. Wallinga, Electronics Letters, vol. 27, No. 8, pp. 639-640, Apr. 11, 1991.
"A study of BEOL resistance mismatch in double patterning process," S. Yao, L. Clevenger and N. Zamdmer, 2015 IEEE International Interconnect Technology Conference and 2015 IEEE Materials for Advanced Metallization Conference (IITC/MAM), Grenoble, Feb. 2015, pp. 147-150.
"Mismatch characterisation of chip interconnect resistance," J. Deveugele, Libin Yao, M. Steyaert and W. Sansen, Proceedings of the 2005 International Conference on Microelectronic Test Structures, Apr. 2005, pp. 183-186.
"Mismatch and parasitics limits in capacitors-based SAR ADCs," Y. Zhang, E. Bonizzoni and F. Maloberti, 2016 IEEE International Conference on Electronics, Circuits and Systems (ICECS), Monte Carlo, Jun. 2016, pp. 33-36.
"Common-Centroid Capacitor Layout Generation Considering Device Matching and Parasitic Minimization," M. P. Lin, Y. He, V. W. Hsiao, R. Chang and S. Lee, IEEE Transactions on Computer-Aided Design of Integrated Circuits and Systems, vol. 32, No. 7, pp. 991-1002, Jul. 2013.
B. Razavi, "The Current-Steering DAC [A Circuit for All Seasons]," IEEE Solid-State Circuits Magazine, vol. 10, No. 1, pp. 11-15, Jan. 31, 2018.
"Layout of analog and mixed analog-digital circuits," Design of analog-digital VLSI circuits for telecommunications and signal processing, Jan. 1994, Franco Maloberti, pp. 341-367.
"The art of analog layout", A. Hastings, Prentice Hall, 2000, 172 pages.
"Zero-skew-clock algorithms for high performance system on a chip," Yen-Tax Lai, Yung-Chuan Jiang and Cheng-Hsiung Tsai, Proc. 2004 IEEE Asia-Pacific Conference on Circuits and Systems, Tainan, Dec. 6, 2004, pp. 169-172.
"CMOS IC layout", D. Clein, Newnes, 2000, 282 pages.
"A 4× Interleaved 10GS/s 8b Time-Domain ADC with 16× Interpolation-Based Inter-Stage Gain Achieving >37.5dB SNDR at 18GHz Input," M. Zhang, Y. Zhu, C. Chan and R. P. Martins, 2020 IEEE International Solid-State Circuits Conference—(ISSCC), San Francisco, CA, USA, Feb. 16, 2020, pp. 252-254.
Wikipedia entry for "repeater insertion," printed from https://en.wikipedia.org/wiki/Repeater_insertion, May 31, 2020, 2 pages.
H. B. Bakoglu, "Circuits, Interconnections and Packaging for VLSI," Addision-Wesley, 1990, index and chapters 5-6, pp i-xiii, 194-279.
J. M. Rabaey, "Digital Integrated Circuits: A Design Perspective," Second Edition, Englewood Cliffs, NJ, Prentice-Hall, Jan. 18, 2002,, chapters 4, 9 and insert A (pp. 133-172, 406-448, and insert pp. 71-76).
A. Nalamalpu ; W. Burleson, "Repeater insertion in deep sub-micron CMOS: ramp-based analytical model and placement sensitivity analysis," 2000 IEEE International Symposium on Circuits and Systems (ISCAS), May 28, 2000, vol. 3, p. 766-769.
Y. I. Ismail and E. G. Friedman, "Optimum repeater insertion based on a CMOS delay model for on-chip RLC interconnect," Proceedings Eleventh Annual IEEE International ASIC Conference (Cat. No. 98TH8372), Rochester, NY, USA, Sep. 16, 1998, pp. 369-373.
V. Adler and E. G. Friedman, "Uniform repeater insertion in RC trees," in IEEE Transactions on Circuits and Systems I: Fundamental Theory and Applications, vol. 47, No. 10, pp. 1515-1523, Oct. 2000.

(56) References Cited

OTHER PUBLICATIONS

N. Ahmed, M. H. Tehranipour, D. Zhou and M. Nourani, "Frequency driven repeater insertion for deep submicron," 2004 IEEE International Symposium on Circuits and Systems (IEEE Cat. No. 04CH37512), Vancouver, BC, May 23, 2004, pp. V-181-184.
Yuantao Peng and Xun Liu, "RITC: repeater insertion with timing target compensation," IEEE Computer Society Annual Symposium on VLSI: New Frontiers in VLSI Design (ISVLSI'05), Tampa, FL, May 11, 2005, pp. 299-300.
Y. I. Ismail and E. G. Friedman, "Repeater insertion in RLC lines for minimum propagation delay," 1999 IEEE International Symposium on Circuits and Systems (ISCAS), Orlando, FL, May 30, 1999, pp. 404-407 vol. 6.
A. Nalamalpu and W. Burleson, "A practical approach to DSM repeater insertion: satisfying delay constraints while minimizing area and power," Proceedings 14th Annual IEEE International ASIC/SOC Conference (IEEE Cat. No. 01TH8558), Arlington, VA, USA, Sep. 12, 2001, pp. 152-156.
R. Venkatesan, J. A. Davis and J. D. Meindl, "Time delay, crosstalk and repeater insertion models for high performance SoC's," 15th Annual IEEE International ASIC/SOC Conference, Rochester, NY, USA, Sep. 25, 2002, pp. 404-408.
V. Adler and E. G. Friedman, "Repeater insertion to reduce delay and power in RC tree structures," Conference Record of the Thirty-First Asilomar Conference on Signals, Systems and Computers (Cat. No. 97CB36136), Pacific Grove, CA, USA, Nov. 2, 1997, pp. 749-752.
Yuantao Peng and Xun Liu, "Low-power repeater insertion with both delay and slew rate constraints," 2006 43rd ACM/IEEE Design Automation Conference, San Francisco, CA, Jul. 24, 2006, pp. 302-307.
K. Banerjee and A. Mehrotra, "A power-optimal repeater insertion methodology for global interconnects in nanometer designs,"in IEEE Transactions on Electron Devices, vol. 49, No. 11, pp. 2001-2007, Nov. 2002.
M. Nekili and Y.Savaria., "Optimal Methods of driving interconnections, in VLSI Circuits," Proc.IEEE Int. Symp. Circuits and Systems, May 10, 1992, pp. 21-23.
V. Adler and E. G. Friedman, "Repeater design to reduce delay and power in resistive interconnect," in IEEE Transactions on Circuits and Systems II: Analog and Digital Signal Processing, vol. 45, No. 5, pp. 607-616, May 1998.
Y. I. Ismail, E. G. Friedman and J. L. Neves, "Optimizing RLC tree delays by employing repeater insertion," Twelfth Annual IEEE International ASIC/SOC Conference (Cat. No. 99TH8454), Washington, DC, USA, Sep. 18, 1999, pp. 14-18.
J. Lillis and Chung-Kuan Cheng, "Timing Optimization For Multisource Nets: Characterization And Optimal Repeater Insertion," Proceedings of the 34th Design Automation Conference, Anaheim, CA, USA, Jun. 9, 1997, pp. 214-219.
C. N. Sze, C. J. Alpert, J. Hu and W. Shi, "Path-Based Buffer Insertion," in IEEE Transactions on Computer-Aided Design of Integrated Circuits and Systems, vol. 26, No. 7, pp. 1346-1355, Jul. 2007.
L. van Ginneken, "Buffer placement in distributed rc-tree networks for minimalelmore delay," in Proc. International Symposium on Circuits and Systems, May 1, 1990, pp. 865-868.
Weiping Shi and Zhuo Li, "A fast algorithm for optimal buffer insertion," in IEEE Transactions on Computer-Aided Design of Integrated Circuits and Systems, vol. 24, No. 6, pp. 879-891, Jun. 2005.
C. J. Alpert and A. Devgan,"Wire segmenting for improved buffer insertion," in Proc. ACM/IEEE Design Automation Conf., 1997, pp. 588-593.
G. Wu and C. Chu, "Simultaneous slack matching, gate sizing and repeater insertion for asynchronous circuits," 2016 Design, Automation & Test in Europe Conference & Exhibition (DATE), Dresden, Mar. 14, 2016, pp. 1042-1047.
W. Zhao, P. Liu, H. Yu, Y. Hu, G. Wang and M. Swaminathan, "Repeater Insertion to Reduce Delay and Power in Copper and Carbon Nanotube-Based Nanointerconnects," in IEEE Access, vol. 7, pp. 13622-13633, Jan. 21, 2019.
H. Zarrabi, A. Al-Khalili and Y. Savaria, "Vt-conscious repeater insertion in power-managed VLSI," 2014 International Symposium on Integrated Circuits (ISIC), Singapore, Dec. 10, 2014, pp. 99-102.
D. Deschacht, "Optimum repeater insertion to minimize the propagation delay into 32nm RLC interconnect," 2011 IEEE Electrical Design of Advanced Packaging and Systems Symposium (EDAPS), Hanzhou, 2011, pp. 1-4.
Sachin S. Sapatnekar, "Timing." Kluwer 2004, ISBN 978-1-4020-7671-8, pp. I-IX, 1-294.
Iban S. Kourtev and Eby S. Friedman, Timing Optimization Through Clock Skew Scheduling, Kluwer, Mar. 31, 2000, 194 pages.
J. Bhasker and R. Chaha, "Static Timing Analysis for Nanometer Designs A Practical Approach," Apr. 2009, Springer, 587 pages.
SS Sapatnekar, RC Interconnect Optimization under the Elmore Delay Model, IEEE31st Design Automation Conference, Jun. 6, 1994, pp. 387-391.
Maheshwar, Naresh, Sapatnekar, S. Timing Analysis and Optimization of Sequential Circuits, ISBN 978-1-4615-5637-4 E Book, Springer, 1999, 201 pages.
"16.2 A 4× Interleaved 10GS/s 8b Time-Domain ADC with 16× Interpolation-Based Inter-Stage Gain Achieving >37.5dB SNDR at 18GHz Input," M. Zhang, Y. Zhu, C. Chan and R. P. Martins, 2020 IEEE International Solid-State Circuits Conference—(ISSCC), San Francisco, CA, USA, Feb. 16, 2020, pp. 252-254.

* cited by examiner

*501*

| ID | Net1_CC [f] | CC_perc [%] | CC_cum [%] | Net1_aggressor | Net2_cc [f] | Net2_aggressor | Net2-Net1 [F] | Net2-Net1 [%] | Matched? |
|---|---|---|---|---|---|---|---|---|---|
| 1 | 2.493e-15 | 28.215 | 28.215 | 0 | 2.493e-15 | 0 | -2.2148e-21 | -8.8842e-05 | 1 |
| 2 | 2.0993e-15 | 23.76 | 51.975 | VOSP | 2.0993e-15 | VOSN | 3.9443e-31 | 1.8789e-14 | 1 |
| 3 | 1.4345e-15 | 16.235 | 68.211 | vdacn | 1.4374e-15 | vdacp | 2.9445e-18 | 0.20484 | 1 |
| 4 | 6.2553e-16 | 7.0797 | 75.29 | dfn<7> | 6.1736e-16 | VREFP | -8.1649e-18 | -1.3053 | -1 |
| 5 | 6.2223e-16 | 7.0423 | 82.333 | VREFP | 6.1192e-16 | dfp<7> | -1.0296e-17 | -1.6547 | -1 |
| 6 | 4.1996e-16 | 4.7496 | 87.081 | XI5/X8/von1 | 4.2015e-16 | XI5/X7/von1 | 5.8337e-19 | 0.13892 | -1 |
| 7 | 3.8795e-16 | 4.3908 | 91.472 | VREFN | 3.8815e-16 | VREFN | 1.9174e-19 | 0.0494 | -1 |
| 8 | 3.6587e-16 | 4.1409 | 95.613 | XI5/vs_offset | 3.6678e-16 | XI5/vs_offset | 9.063e-19 | 0.2471 | -1 |
| 9 | 3.4701e-16 | 3.9275 | 99.54 | dfn<6> | 3.4092e-16 | dfp<6> | -6.0917e-18 | -1.7555 | -1 |
| 10 | 2.1525e-17 | 0.24361 | 99.784 | In_X161/X119/90 | 2.1492e-17 | In_X161/X120/90 | -3.3075e-20 | -0.15366 | -1 |
| 11 | 1.9088e-17 | 0.21604 | 100 | In_X161/X119/91 | 1.9077e-17 | In_X161/X120/91 | -1.1671e-20 | -0.061142 | -1 |
| | 8.8355e-15 | 100 | 100 | VOSN | 8.8196e-15 | VOSP | 1.597e-17 | 0.22602 | 1 |

MATCHED NET AND DEVICE ANALYSIS BASED ON PARASITICS

CROSS-REFERENCE TO RELATED APPLICATIONS

This disclosure is a continuation of U.S. Utility patent application Ser. No. 16/434,454, filed on Jun. 7, 2019, on behalf of first-named inventor Maxim Ershov for "Matched Net And Device Analysis Based On Parasitics," which in turn is a continuation in-part of U.S. Utility patent application Ser. No. 16/429,007, filed on Jun. 2, 2019, on behalf of first-named inventor Maxim Ershov for "Circuit Design/Layout Assistance Based On Sensitivity To Parasitics" (the "prior application"); each of U.S. Utility patent application Ser. No. 16/434,454 and U.S. Utility patent application Ser. No. 16/429,007 also claim priority to U.S. Provisional Patent Application No. 62/682,743, filed on Jun. 8, 2018, on behalf of first-named inventor Maxim Ershov for "Sensitivity-Based IC Design Analysis and Optimization," and to U.S. Provisional Patent Application No. 62/682,748, filed on Jun. 8, 2018, on behalf of first-named inventor Maxim Ershov for "Software System for Verification of Matching Nets and Matching Devices in Integrated Circuit." Each of these prior utility and provisional patent applications is hereby incorporated by reference.

BACKGROUND

Analog and digital circuits often rely on "matching," where respective circuit paths ("nets") and device instances should exhibit precisely-related electrical characteristics, often with a very high degree of precision (these nets, device instances, and/or other elements that should be matched will be referred to as "objects"). Individual objects characteristics can vary in a wide range (by 15-20% or more) due to unavoidable manufacturing variation, temperature variation, and other operating parameters—but for matched objects, it is intended that these characteristics should track each other precisely irrespective of variations in manufacturing and operating conditions variations. A "matched circuit" is a circuit that relies on two or more such matched objects for proper operation. Such matched circuits can form an important element in many types of electronic components, such as latches, memory cells, comparators, random bit generators, data converters, differential circuits, and many other types of structures. Use of a matched circuit can provide a number of benefits depending on design and application, including higher linearity, low power consumption, greater sensitivity, greater reliability, greater unpredictability, and other types of benefits.

One non-limiting example of a matched circuit design is depicted in FIG. 4A, which shows a "strongarm" latch. A strongarm latch might be employed as a comparator circuit depending on application; if right and left halves of this circuit (i.e., and each of their constituent reciprocal structures, i.e., pathways and device instances) are evenly matched, a polarity of $V_{in1}$–$V_{in2}$ will appear as a bit of information at nodes $V_{out}$ (i.e., with a differential voltage being seen across nodes X and Y according to whether $V_{in1}$ or $V_{in2}$ is relatively larger). However, if there are any differences between these circuit halves (or any nearby structures, which might act as aggressors or cause other effects), the circuit may not operate correctly. Note that there are matched circuits that feature more than two matched objects (e.g., three, four, twelve, or another number of matched paths), as well as circuits where the relationship between matched objects is non-equal, e.g., where object should exhibit exactly twice the voltage or capacitance of another object, and so on. Generalizing the issues with asymmetry to some of the examples given above, this can result in a design where a memory cell or comparator does not operate reliably, or where a random bit generation has definite statistical tendencies instead of being truly random. Other types of problems can also occur if any supposedly-matched objects are not correctly related in their operating characteristics; note that a circuit design might require that signal delays, capacitances, resistances, current flows, voltages, and/or other characteristics of reciprocal nets be precisely related over a wide range of process variation, bias conditions, temperatures, signal frequencies, and other operating conditions.

Unfortunately, the operating characteristics in practice may vary significantly between reciprocal objects. For example, it might be that asymmetry exists between paths in the 3D layout of an electronic circuit design, such that one path or element experiences a different capacitive coupling than a counterpart path or element (i.e., than a reciprocal net). Unavoidable process variations can include front and/or back end of line variations (i.e., "FEOL" and/or "BEOL" variations), such as where a layer for one matched path is thicker or differently dimensioned than another; these variations can give rise to a myriad of effects, including asymmetric gate voltages, frequency- or temperature-dependent effects, and other forms of asymmetry. Note that while FIG. 4A depicts a conventional schematic-level diagram for a strongarm latch, asymmetries of the type that interfere with matched circuit operation in practice often arise not from schematic-level issues, but rather from the specific layout or extraction of an electronic circuit design, i.e., from the actual specific placement of and dimensioning of reciprocal paths or elements in a given integrated circuit, package or printed circuit board design ("integration design"), and from associated process corners associated with building/replicating that given integration design.

Achieving close to ideal matching in the layout and/or extraction of a given integration design is difficult and typically requires skill in large or very large scale integration ("LSI"/"VLSI") and mastery of electronic design automation ("EDA") tools. A LSI or VLSI layout file is typically quite complex, and asymmetries frequently occur unintentionally, even for very experienced layout engineers.

Verification of whether matching is successful or not is not an easy task. Visual inspection of a two or three dimensional ("2D" or "3D") graphical rendering of a layout for matching violations might occasionally permit a designer to spot an obvious defect in the case of a simple design. However, a typical layout editor's graphical rendering typically presents an overwhelming number of elements, and it may be very hard to see, through a myriad of metal lines and vias, whether reciprocal nets are matched or not. Asymmetry can also arise from causes that may be hard to spot; for example, asymmetry can arise not just from obvious geometric anomalies (e.g., differences in layer or via width or length), but also from other nearby structures, such as from capacitive coupling, floating metal fill effects, well proximity effect, or other, similar types of effects. Also, matching verification is typically postponed until a late stage of post-layout simulation. If results of post-layout simulations are good, matching is typically assumed. If the results are poor, it can be hard to distinguish the effect of mismatch on the final simulation results from other effects impacting the design; even if the existence of a mismatch is identified, identifying the underlying root causes of the mismatch may be very hard.

What are needed are techniques for addressing these difficulties, that is, for improvements in circuit design tools (e.g., layout editors) which facilitate matching analysis and verification. The present invention satisfies these needs and thus provides an improvement in the functioning of electronic design automation ("EDA") tools and/or analysis tools for building and evaluating integrated circuit designs and for improving those integrated circuit designs.

BRIEF DESCRIPTION OF THE DRAWINGS

The patent or application file contains at least one drawing executed in color. Copies of this patent or patent application publication with color drawing(s) will be provided by the US Patent and Trademark Office upon request and payment of the necessary fee.

Figure 1:
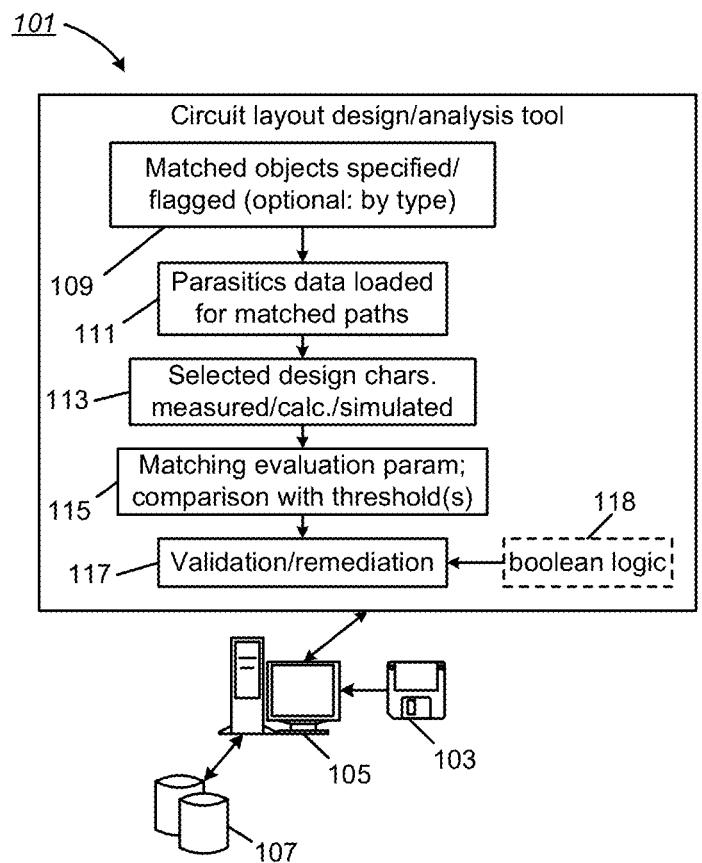
FIG. 1 is a block diagram showing one embodiment of techniques for matched object analysis based on parasitics.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application. Without limiting the foregoing, this disclosure provides several different examples of techniques that can be used to improve the functioning of electronic design automation, analysis and/or layout tools, and to speed up the development of the effective circuit integration. The various techniques can be embodied as software, in the form of a computer, device, service, cloud service, system or other device or apparatus, in the form of a circuit design or layout or netlist file produced or modified as a result of these techniques, or in another manner. While specific examples are presented, the principles described herein may also be applied to other methods, devices and systems as well.

DETAILED DESCRIPTION

This disclosure provides techniques for addressing the aforementioned problems by receiving and processing parasitic elements for a given electronic circuit design. The parasitic elements (or "parasitics") typically are identified from a post-layout netlist (or are extracted from a layout of a given electronic circuit design (i.e., a specific integration design) and will vary as individual layers (e.g., device stack layers, conductive traces, vias, interconnects, and other structures) are moved/changed in three-dimensions, as well as in a manner dependent on materials used (including any separating dielectrics) and other factors. Note that standardized expressions exist for expressing a post-layout netlist, including without limitation the Standard Parasitic Format (SPF), the Detailed Standard Parasitic Format (DSPF), the Standard Parasitic Exchange Format (SPEF), Open Access (OA) extracted view, SPICE netlist, and other formats. In one embodiment, parasitics are broken down to as fine a granularity as possible, and to this end, a DSPF format can be advantageously used (or generated if not readily available); however, it is also possible to apply techniques disclosed herein to other parasitic expression formats including without limitation those referenced above. Digital values provided by these formats can represent one or more conventional types of parasitic values including by way of example, resistances, capacitances, and inductances (mutual- or self-inductances) expressed in some unit of measure; in some implementations, the parasitic elements can be of mixed types. The disclosed techniques operate on these parasitics by determining how they affect a given circuit design characteristic for two or more reciprocal objects (including nets and device instances), and then automatically (or upon command) comparing these objects to determine whether they (or a weighted version of them) are matched within an appropriate threshold (e.g., within a predetermined or specified level of tolerance). As an introductory example, should a particular conductive trace in a hypothetical "matched" circuit design act as an aggressor and give rise to a coupling capacitance that differently impacts supposedly-matched objects as respective victims, the disclosed techniques might be applied by a circuit analysis tool to (a) identify and quantify parasitics affecting each matched object, i.e., by extracting values from a post-layout netlist, (b) compare the quantified parasitics (or a circuit design characteristic dependent on those parasitics, such as by way of example, RC delay) with each other to obtain a figure of merit representing how well-matched the objects are (e.g., a value representing the difference in these parasitics or circuit design characteristics, or a difference between a weighted representation of them), (c) compare the figure of merit to a threshold, in order to determine whether the matching is "good enough" or not, and (d) generate a display image or other result which identifies specifically why matching has failed (e.g., by identifying parasitics to which match failure is attributable). This then permits a designer to immediately evaluate a design and rectify issues (e.g., by moving a specific via, layer or other structure) that causes certain parasitics that are at the root of the asymmetry. Exemplifying further, in one embodiment, these techniques can be applied to generate an output that permits a designer to interactively redesign structural elements (e.g., by moving or resizing those elements, or by changing related material properties) and to visualize in real-time how this adjustment (and its associated change, e.g., to a coupling capacitance) incrementally affects matching. The results of the parasitics' analysis contemplated by this disclosure can be visually rendered, stored for future use, or provided to circuit design/layout software to apply modifications to design/layout so as to adjust circuit design/layout to meet the design requirements of a given specification. As should be appreciated therefore, the disclosed techniques provide a general class of operations and capabilities that are typically not provided by conventional layout, design and/or simulation software, and they provide a tool for a designer or layout engineer to much more easily identify, understand and correct the effects parasitics on matched circuit design in any given circuit design/layout. The disclosed techniques also provide a mechanism for automated matched circuit validation (and for validating matching in many structures of a given integration design).

Figure 4A:
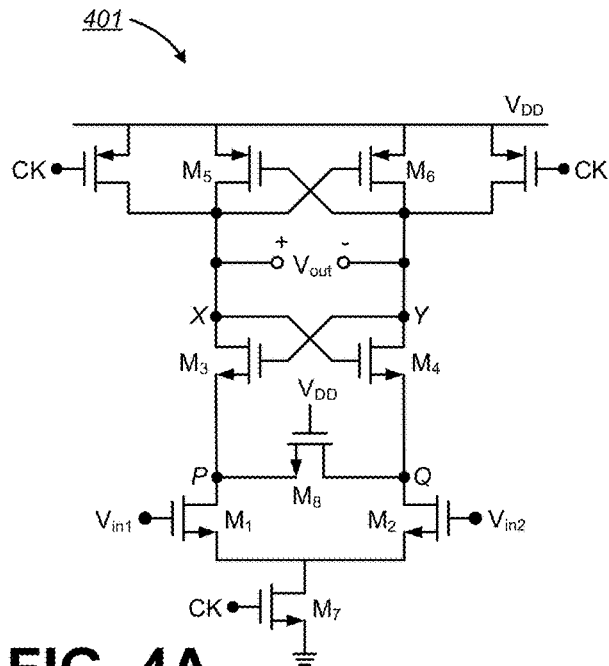
FIG. 4A is a schematic illustrating configuration of a "strongarm" latch.

In one embodiment, the techniques disclosed herein can be embodied as an improvement to a software-instantiated analysis electronic circuit layout computer-based tool. Such a tool first identifies one or more matched circuits, or one or more sets of supposedly-matched objects, represented by a given integration design. In one embodiment, this identification can be automatically performed, for example, by identifying a device instance type (or have a design cell automatically tagged by a design tool) as a matched circuit or matched structure. In a different embodiment, a designer can manually select two or more nets or device instances to compare. In yet another embodiment, software and/or the designer can automatically break a standard cell for a matched circuit down into many combinations or permutations of such objects, for example, representing paths, device instances, layers, nodes, elements or other structures that should be precisely-related in operation for a circuit under analysis for purposes of matching analysis (e.g., every permutation of every node pair in a matched net, and interrelationships with nearby nets). The tool receives into a processor-readable storage medium a post-layout netlist file representing parasitic elements and device instances information, extracted from the given integration design; as mentioned, in various embodiments, this netlist file can be structured according to a widely recognized or standardized format for parasitics representation, for example, generated from a design/layout using a conventional extraction tool, including without limitation the Standard Parasitic Format (SPF), the Detailed Standard Parasitic Format (DSPF), the Standard Parasitic Exchange Format (SPEF), Open Access (OA) extracted view, SPICE netlist, and other formats. Note that the expressed parasitic elements ("parasitics") are typically derived from a parasitic extraction, i.e., they include values representing the materials, dielectrics, coupling capacitances and other values that arise from the relative positioning and organization of structures in the integration design, and are typically not derivable simply from a general circuit schematic (e.g., such as seen in FIG. 4A). In one embodiment, parasitics are broken down to as fine a granularity as possible, and to this end, a DSPF format can be advantageously used (or generated if not readily available); however, it is also possible to apply techniques disclosed herein to other parasitics' expression formats including without limitation any of those referenced above. Digital values provided by these formats can represent one or more conventional types of parasitic values including by way of example, resistances, capacitances, and inductances (mutual- or self-inductances) expressed in some unit of measure; in some implementations, the parasitic elements can be of mixed types or unit-less. If the netlist file does not have parasitics' data, or conversely, does not have parasitics expressed at a sufficient level of granularity, in one embodiment, these parasitics are then computed using an extraction tool. With at least one processor, the tool then processes ones of the parasitic elements associated with a first one of the matched objects, and processes ones of the parasitic elements associated with a second one of the matched objects, to compute a value of a matching evaluation parameter for the matched objects. In some embodiments, this matching evaluation parameter can be preselected (e.g., inferred from a view selected by the designer or selected via a drag-down list by the designer), and depending on which matching evaluation parameter is selected/used, the tool then selects a subset of the parasitics for each matched object which are pertinent to calculation/simulation/modeling of the particular matching evaluation parameter. For example, the matching evaluation parameter can be based on any characteristic or measure of a circuit that is to be understood, for example, RC delay, total resistance, total capacitance, impulse response, a signal delay time, a transfer function, a channel bandwidth, a voltage drop, a current density, transient characteristics, and potentially many other types of circuit performance parameters and/or any other desired characteristic. A matching evaluation parameter is a parameter that is associated with the matching (or lack thereof) of the supposedly-matched objects under consideration; in one embodiment, it is simply a difference value between a pre-selected or inferred one of the design characteristics, e.g., RC Delay$_{net1}$–RC Delay$_{net2}$, or a scaled or weighted version of them. An example here might be helpful—referring briefly to FIG. 4B, it might be that one unintended coupling capacitance 413 ($C_1$) is greater than another 415 ($C_2$) for respective, supposedly-matched objects, and that this causes a different delay for net {P→$M_1$} than for net {Q→$M_2$}. A suitable matching evaluation parameter might be difference in the times of these two delays, expressed using any desired unit of measure. Once the desired matching evaluation parameter is calculated, simulated, modelled or otherwise measured, this matching evaluation parameter is then compared to a suitable threshold; such a threshold can be selected in advance or dynamically by the designer, or it can be prepopulated and/or inferred from the cell-type or design of interest. For example, for one type of integration design, a difference in delays between the two objects {P→$M_1$} and {Q→$M_2$} of more than 10 picoseconds might be unacceptable, while for a different type of integration design, such a value might be well within an acceptable tolerance level. A result of comparison is then computed and then used to create or render a display that will be presented to the designer. In one embodiment, such a display can be based on one matching result only (e.g., a flag indicating that the delays for the two objects just referenced is within tolerance); in another embodiment, such a display can be based any number, combination and/or permutation of such results, e.g., obtained using a number of different matching evaluation parameters. For example, turning briefly to the schematic presented by FIG. 4A and taking a very simplified hypothetical example, it might be that the software tool is configured to automatically validate an associated integration design (and to display a result indicating successful validation) PROVIDED THAT all of the following criteria are satisfied:

RC Delays for all objects connecting $V_{in1}$ with $V_{out+}$ are in aggregate within +/−5.0% of RC delays for all objects connecting $V_{in2}$ with $V_{out-}$;

RC Delays for all objects connecting $V_{in1}$ with $V_{out-}$ are in aggregate within +/−5.0% of RC delays for all objects connecting $V_{in2}$ with $V_{out+}$; and $V_{th}$ for each of $M_1$, $M_3$ and $M_5$ is within +/−5.0% of $V_{th}$ of matched devices $M_2$, $M_4$ and $M_6$.

Naturally, this example introduces a simple hypothetical set of validation criteria for purposes of narration, but as should be apparent, a designer and/or design tool can predicate automated or assisted validation on any number of desired matching criteria with any desired, respective thresholds. Conversely, if any criteria do not match, the generated display can be configured to identify which specific matching evaluation parameter or parameters resulted in a match failure, and how far out of bounds the respective matching evaluation parameter is (relative to the pertinent threshold). In various embodiments, automated design remediation options can be presented, such as for example, provision of automated/suggested layout modifications by the tool (e.g., suggesting a move of a structural element) so as to reduce an offending parasitic associated with one of the supposedly-matched objects, where the move is selected/ calculated so as to correct the offending matching evaluation parameter so that it is within range (and will result in a validation of the circuit). In another contemplated implementation, the tool is configured to provide or suggestion one or more pareto optimal solutions (i.e., which satisfy many design criteria simultaneously), with a designer selecting a suggested solution using the tool, and with the tool then automatically triggering re-extraction and/or update of a design file stored in non-transitory storage so as to commit the design modification to the given integration design. Clearly, many possible implementations will occur to a skilled EDA designer and/or software architect.

Figure 6A:
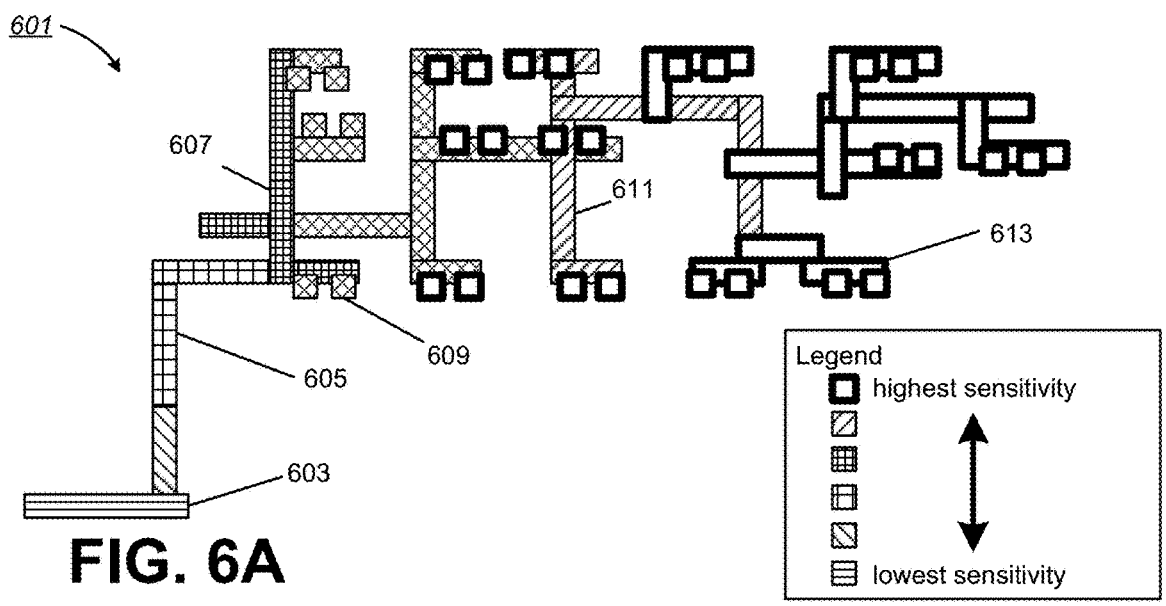
FIG. 6A is a 2D graphical depiction of structural elements that make up a hypothetical net, rendered in a manner that graphically overlays sensitivities (e.g., of the circuit design characteristic being modeled, such as "RC delay") to each individual parasitic. For example, as indicated by a legend in the lower-right corner of FIG. 6A, polygons with a dark (thick) outer line (e.g., structure 613) have a greater proportionate influence on overall RC delay of the circuit path of interest than structures with a thin outer line and simple hatching (e.g., structure 603). A rendering of this type interrelates parasitics to layout and permits a designer to visualize exactly where blocking parasitics might be creating problems for the given layout/design (and consequently, where asymmetry may arise). This may help a designer immediately capture layout mistakes, or understand root causes of such asymmetry, i.e., at a relatively early stage in the integration process.
Figure 6B:
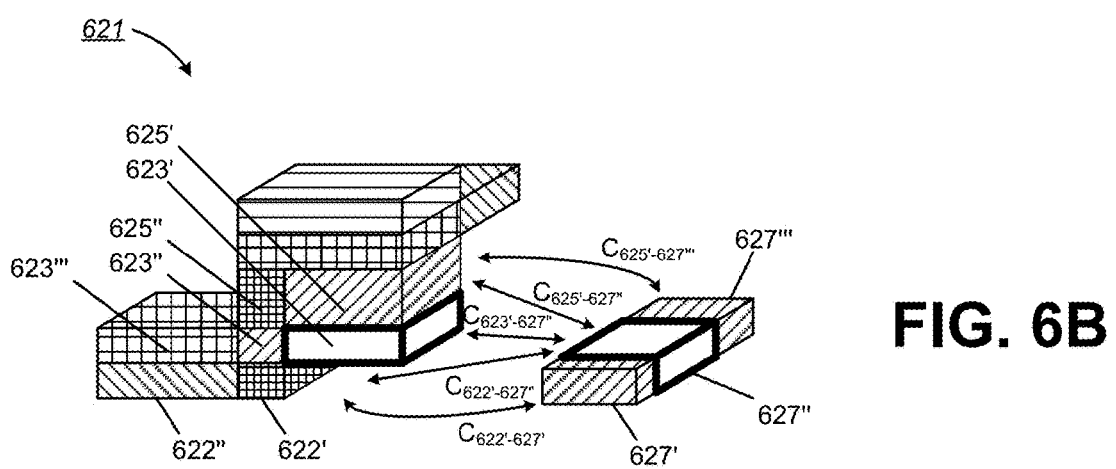
FIG. 6B shows a 3D rendering of structures from FIG. 3A, now overlaid with associated per-parasitic sensitivities of the performance parameter of interest. A designer employing such a 3D visualization, for example, can individually change the 3D layout of individual paths of the depicted circuit (for example, by interactively moving layout of sublayer 617', sublayer 617" and/or sublayer 617''') so as to dynamically reduce the sensitivity of the performance parameter (e.g., RC delay) to individual parasitics (e.g., to "$C_{313'-317'}$"). For example, a designer might interactively move or redesign layer 617 (or any of its sublayers) and observe change in displayed sensitivity of the listed parameter (e.g., RC delay for the depicted path) to associated parasitics.

In other embodiments, a display can be rendered using "temperature" to assist a designer in assessing which aspects of a design cause matched objects to be unacceptably asymmetric. "Temperature" in this case refers to a relative emphasis or highlighting that, for example, indicates how far away from acceptable tolerance a specific aspect of a design is. In one embodiment, a two-dimensional (2D) or three-dimensional (3D) display can be created which uses color to indicate which aspects of asymmetry create issues, and the relative extent to which any associated object—such as an individual metal layer or layer of a device instance—is a significant contributor to matching failure. For example, as will be shown by some examples below, a red color can be used for poorly-matched objects, an orange or yellow color can be used for nets which are mildly asymmetric, or just outside of acceptable tolerance, while a cool color such as black, blue or other color can be used for objects which are determined to match within a defined tolerance (i.e., for the particular matching evaluation parameter under consideration, or some combine or overall figure of merit). For tool designs which compare many combinations and/or permutations of individual objects within a matched circuit, such a design permits a designer to quickly identify, focus on, and rectify exactly that component which is creating problems. For example, turning again to the example of FIG. 4A, if the only objects within the depicted strongarm latch which are out of bounds for a particular matching evaluation criteria are mismatched transistor thresholds for transistors $M_1$ and $M_2$ (e.g., because of a cause such as well proximity effect, as illustrated by FIG. 4D), one rendering might display a depiction as seen in FIG. 4A (or a layout, e.g., per FIG. 4) with one or both of these individual transistors colored (e.g., in red) according to how dissimilar their gate voltages are. Examples which further use parasitics' data to tie matching evaluation parameters back to their design structural elements and/or nets for purposes of coloring (or indicating "temperature") of those parasitics and/or elements, are illustrated in FIGS. 6A and 6B.

In addition to an improvement in EDA tools, the techniques introduced above can be embodied as an apparatus comprising instructions store on non-transitory storage media which perform functions similar to those performed above, to a system comprising a computer and such instructions, to an integration design or netlist created using such techniques (e.g., stored on non-transitory storage media), and to other forms of implementations as well.

As should be apparent from the foregoing, apparatuses and methods which embody the techniques described in this disclosure can provide a powerful tool for analysis and debugging of IC matched circuit designs sensitive to or dominated by layout parasitics, and can greatly streamline the process of circuit layout and design optimization. Note that the described techniques provide number of advantages in terms of providing new capabilities to a circuit designer, all with substantially-enhanced speed. In addition to other advantages already discussed above, a linear solver can be used to compute/measure/model a design characteristic of interest (and associated matching evaluation parameters), providing substantial advantages over techniques that rely on complex simulations and nonlinear analysis; the techniques discussed above provide a visualization mechanism that, in some embodiments, ignores device characteristics and instead relies on boundary conditions and parasitics as inputs, that is, facilitating such faster, linear analysis. By using binarization and memory management techniques, as introduce by the prior application which was incorporated above by reference, and by enabling a design to filter parasitics used for computation (e.g., by specifying a selected or group of selected matching evaluation parameters, and thereby focusing on a small set of parasitics) and/or thresholded for matching validation, the techniques described above permit a designer (and design tool) to quickly identify and focus on just the most significant bottlenecks/issues, in a manner that would typically not be possible with conventional simulation tools. By providing techniques where a designer can select different circuit design characteristics and nets to model, the present techniques provide a robust mechanism that permits a designer to quickly and easily screen for a myriad of potential circuit design issues that might affect matching; these techniques are fully integratable into/with traditional platform used for circuit analysis (e.g., layout, SPICE/simulation and other EDA tools). It should therefore be appreciated that the techniques introduced by this disclosure provide for substantial improvement in the field of EDA.

With various system elements thus introduced, this description will now proceed to describe the various figures ("FIGS.") and provide additional detail concerning various specific embodiments. Generally speaking, it is specifically intended that any of the cited structures, operations, algorithms, features, use models, applications or operands ("elements") can be mixed and matched, and included or omitted in any combination or permutation as desired or as pertinent to the particular application; that is to say, while several specific detailed examples discussed herein feature specific combinations of certain elements, it is generally contemplated that inclusion of any these elements are optional relative to one another and can be combined in any manner suitable or appropriate to a specific design.

Note that several additional terms used herein should be introduced. First, "circuitry" can refer to analog or digital electronic elements (e.g., dedicated logic gates), either arranged as special purpose circuitry that necessarily performs a certain function when electrically motivated, or as general purpose circuitry (e.g., a processor) that is controlled or otherwise configured by instructions (software) so as to adapt that circuitry to perform a specific function and cause that circuitry to operate as though it was special purpose circuitry. "Processor" as used herein refers to a set of configurable hardware circuit elements or hardware circuit elements that can be controlled to perform any one of a number of different functions including, without limitation, an FPGA, microprocessor, microcontroller, whether or not embodied in a standalone die or as a discrete integrated circuit. "Instructions" and "software" typically refer to instructional logic for configuring and/or controlling operation of a processor. Such instructions are typically written or designed in a manner that has certain architectural features such that, when those instructions are ultimately executed, they cause the one or more general purpose circuits or hardware devices (e.g., one or more processors) to necessarily perform certain described tasks. "Logic" can refer to software logic (i.e., instructional logic) or hardware logic (e.g., a digital chip or board design) or a combination of these things. "Non-transitory machine-readable media" means any tangible (i.e., physical) storage medium, irrespective of how data on that medium is stored, including without limitation, random access memory, hard disk memory, optical memory, a floppy disk or CD, server storage, volatile memory, memory card and/or other tangible mechanisms where instructions may subsequently be retrieved by a machine (such as one or more processors). The machine-readable media can be in standalone form (e.g., a program disk, solid state memory card, whether bootable or executable or otherwise, or in other memory) or embodied as part of a larger mechanism, for example, a laptop computer, portable or mobile device, server, data center, "blade" device, subsystem, electronics "card," storage device, network, or other set of one or more other forms of devices. The instructions can be implemented in different formats, for example, as metadata that when called is effective to invoke a certain action, as Java code or scripting, as code written in a specific programming language (e.g., as C++ code), as a processor-specific instruction set, or in some other form; the instructions can also be executed by the same processor or common circuits, or by different processors or circuits, depending on embodiment. For example, "instructions stored on non-transitory machine-readable media" typically refers to software stored on disk or in other physical memory or storage, where the software is structured such that when it is later (ultimately) installed or executed by an operator or end user, it configures a machine (e.g., one or more processors) so that they operate in a prescribed manner. In one implementation, instructions on non-transitory machine-readable media can be executed by a single computer or processor and, in other cases as stated, can be stored and/or executed on a distributed basis, e.g., using one or more servers, clients, or application-specific devices, whether collocated or remote from each other. Each function mentioned in the disclosure or FIGS. can be implemented as part of a combined program or as a standalone software module (i.e., an invocable or callable program or subroutine), either stored together on a single media expression (e.g., single floppy disk) or on multiple, separate storage devices, or in the form of dedicated circuitry or circuitry combined with such software. Throughout this disclosure, various processes will be described, any of which can generally be implemented as instructional logic (e.g., as instructions stored on non-transitory machine-readable media), as hardware logic, or as a combination of these things, depending on embodiment or specific design. A circuit design, or schematic, as used herein generally refers to a generalized description of how component structures in an electronic circuit should be connected together. In the process of circuit design, a schematic is then laid out in a manner such that two-dimensional (2D) pathways are geometrically positioned relative to one-another. A circuit description is then extracted as a netlist which takes into account precise materials, dielectrics, 3D dimensioning, and other factors, and models the entire circuit design as a netlist, i.e., a list of connected nets. A "net" is simply a set of electrically-connected structures, and a netlist is a list that lists the various nets of an electronic circuit and describes how they are connected. Some, but not all netlist formats, will contain a description of parasitic elements created by the particular design, e.g., given characteristics of the various metal layers, vias, dielectrics and device instances that make up a particular design. A "node" as used herein refers to any type of specified "point" in a circuit design (e.g., whether or not such serves as a junction between two elements or signal paths). A "structural element" as used herein refers to any physical structure or hierarchy of physical structures in a given circuit design, for example, an individual parasitic (e.g., that might be expressed as an incremental resistance for just a small part of a circuit trace), a group of parasitics (e.g., lumped RC effects attributable to a given polygon or layer), or indeed, any part of a circuit design (e.g., a via, a layer, a group of layers, and so forth). "Asymmetric" as used herein means that supposedly-matched objects exhibit operating characteristics that do not correspond to each other as intended, while "reciprocal" objects are objects that are intended to have some type of predetermined relationship that interrelates one or more of their operating parameters. "Module" as used herein refers to a structure dedicated to a specific function; for example, a "first module" to perform a first specific function and a "second module" to perform a second specific function, when used in the context of instructions (e.g., computer code), refer to mutually-exclusive code sets; these code sets can be embodied as different code portions (e.g., different sets of lines in a common-program) or respective standalone routines, programs or files. When used in the context of mechanical or electromechanical structures (e.g., a "sensor module"), the term module can refer to a dedicated set of components which might include hardware as well as software); for example, an "encryption module" and a "network registration module" would refer to dedicated, mutually exclusive components for performing tasks of encryption and network registration, respectively, and they might be discrete code sets or have discrete mechanical structures, or both, depending on context. In all cases, the term "module" is used to refer to a specific structure for performing a function or operation that would be understood by one of ordinary skill in the art to which the subject matter pertains as a conventional structure used in the specific art (e.g., as a software module or hardware module as those terms would be understood in the context of computer and/or software engineering and/or circuit integration), and not as a generic placeholder or "means" for "any structure whatsoever" (e.g., "a team of oxen") for performing a recited function (e.g., "encryption of a signal"). "Electronic" when used to refer to a method of communication can also include audible, optical or other communication functions, e.g., in one embodiment, electronic transmission can encompass optical transmission of information (e.g., via an imaged, 2D bar code), which is digitized by a camera or sensor array, converted to an electronic digital signal, and then exchanged electronically. Generally speaking, reference will be made herein to instructions such as computer code which, "when executed," cause one or more processors to perform a specific task; this usage should be interpreted as referring to the intended design and operation of software (e.g., such as might, following software sale and/or distribution, be installed and executed by a software licensee or an end-user).

FIG. 1 is a block diagram showing one embodiment of some of the techniques introduced above. As indicated by reference numeral 101, these techniques can be embodied in a circuit layout design or analysis tool, for example, as a dedicated software package or as a module of a tool that provides other functions, for example, SPICE analysis. As indicate by numeral 103, in one embodiment, the tool (or a module thereof) is defined by instructions stored on non-transitory machine- or processor-readable storage media (denoted by a floppy disk icon). These instructions when executed by one or more processors cause the one or more processors (seen as a computing device 105) to operate on an integration design, for example, stored as one or more files in a main memory or mass storage 107. Conventionally, an integration design is extracted from one or more design files and results in a post-layout netlist file which may be many gigabytes in size and may represent many thousand to millions of structures, expressed as layers, device instances, parasitic elements, and so forth.

Consistent with the techniques introduced above, the tool in question provides for identification of matched objects within a given integration design, per function block 103. As expressly indicated by function block 109, this identification can be inferred (e.g., from a cell type or other parameters) or explicitly flagged by a designer as a circuit that is to be scrutinized for matching analysis. One or more matching parameters that are to be evaluated are also effectively specified, i.e., either dictated by the design of the tool or electively specified by the circuit designer. The identification or a matched circuit and the identification of one or more matching evaluation parameters that are to be assessed is then used to extract just those parasitics from the post-layout netlist file which are needed for analysis. That is, since a netlist file can be prohibitively large, and require many minutes to load and/or process for some integration designs, in some embodiments, only relevant parasitics are extracted from main memory (or mass storage) and loaded into local random access memory (RAM) for purposes of processing by the tool; this helps speed operation, such that processing can be performed in real-time. To help illustrate this principle, it should be considered that a small portion of a hypothetical large scale circuit might feature a voltage supply ("$V_{DD}$") and a conductive trace which extends to a device instance, for example, to the source of transistor "$M_5$" in FIG. 4A. Expressed in terms of DSPF, a parasitics representation of even such a small portion of the overall design might have many dozens-to-hundreds of entries, expressed as part of an interconnection of nets (each a separate section of the DSPF file structure). Each net in the DSPF file would be expressed as a series of ASCII character line-based entries, with individual lines each representing a resistor or capacitor used to model both ideal and non-ideal behavior of the particular of the circuit portion, with input pins, loads and connections to other nets or subnets represented, and with x-y coordinates and normalized capacitance and resistance units expressed for each resistor/capacitor used to model this circuit portion. The DSPF representation for the overall integration design might consist of tens of thousands of nets, or more, depending on the size of the large-scale integration (LSI) or very large-scale integration (VLSI) project at issue, with dozens to hundreds of lines per net. As mentioned, load time and processing time for a file of this type can be prohibitively-slow depending on the design.

Figure 2:
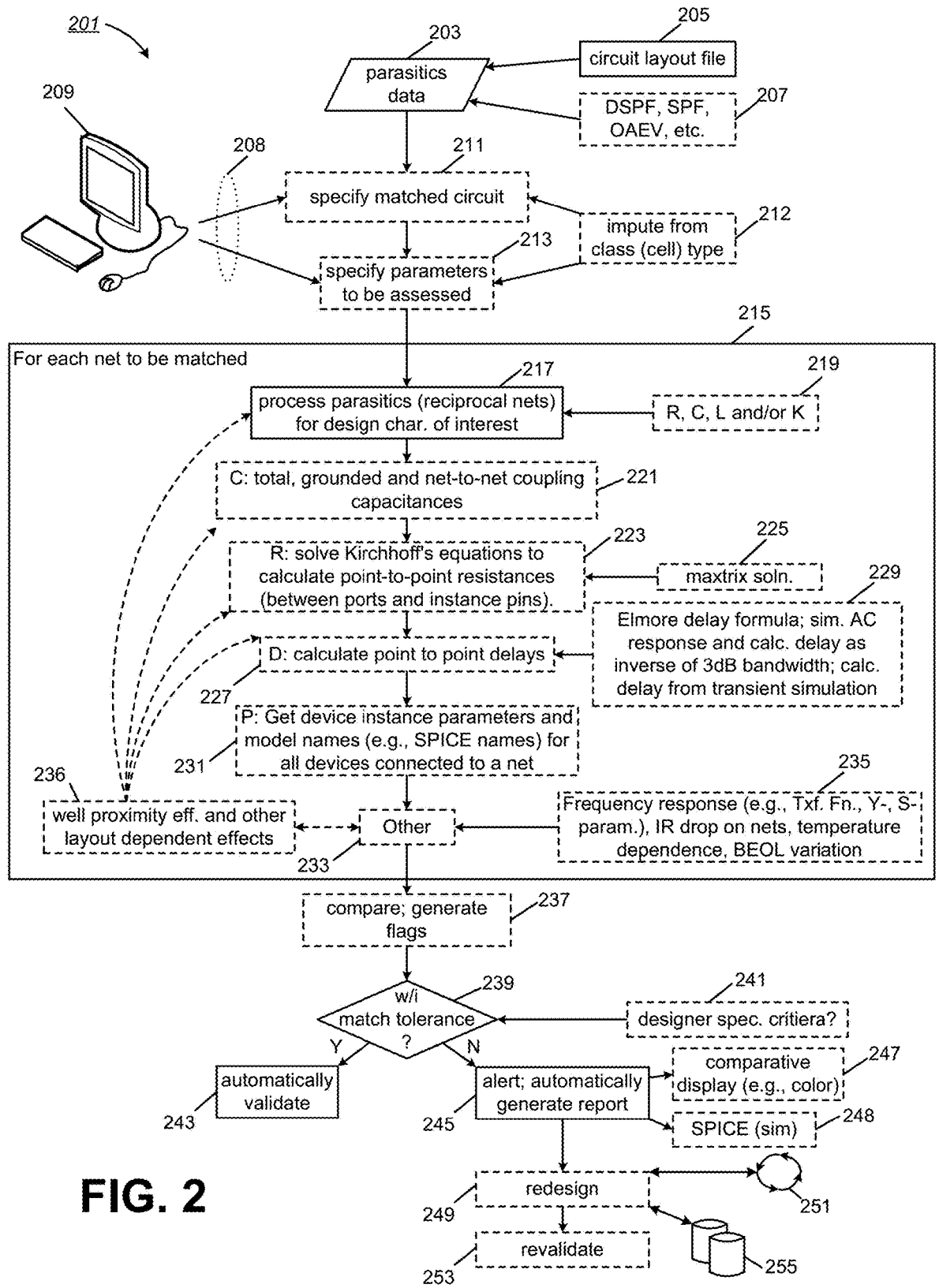
FIG. 2 is a block diagram showing another embodiment of techniques for matched object analysis based on parasitics.

To address this issue, as discussed in reference to FIG. 2 of the incorporated by-reference prior application, a computer 105 can advance-digest the post-layout netlist (PLN) file to dramatically improve processing speed. Rather than operate on the ASCII character DSPF or equivalent file (which can be prohibitively large as reference), the computer 105 can first load the post-layout netlist file and convert it from ASCII to a binary form, as it does so, building an index which identifies each object (and any other desired node or point, e.g., such as matched circuit ports) using a direct offset into the binary file. The resulting binary file and index file are stored in main memory for future use, while the index file is also loaded into RAM (i.e., local, fast-access memory) for purposes of parasitics' processing. When and as a designer wishes to evaluate performance of a particular section of a given circuit design, for example, part of the strongarm latch of FIG. 4A, the index is used to identify just that binary data in main memory or mass storage which is needed for processing, and to permit computer 105 to retrieve only a portion of the parasitics' data needed (as opposed to an entire, potentially-massive ASCII-based PLN or other parasitics' file) and to load only that portion from main memory to RAM for local processing. This pre-digesting of this data greatly reduces both load time and processing time, in many cases to such an extent that run-time matching analysis as discussed herein can be performed quickly, potentially in real-time (i.e., instantaneously), even for large projects. In one contemplated embodiment, a memory manager can be used to perform direct memory access (DMA) in order to retrieve binary data of interest (e.g., such that ensuing processing is unencumbered by the need for file dynamic file allocation and/or address translation processing).

Returning to FIG. 1, such techniques are optionally used to retrieve parasitics' data which is of interest into local memory, per function block 111. This parasitics' data represents just the data needed for matched object analysis (e.g., all associated or identified parasitics' data from the larger PLN file), and thus, the system is unencumbered from having to manipulate the entire, massive PLN file. Using these parasitics, and the specification of one or more matching evaluation parameters (and associated design characteristics upon which matching is evaluated), the tool then calculates, simulates or models (113) values for one or more particular circuit design characteristics for each affected net. The affected objects (e.g., any reciprocal subsets of nets or structures in the matched circuit) can be automatically identified by the software tool or manually specified or filtered by the designer. In one embodiment, the designer specifies a matched circuit (or cell), e.g., such as the strongarm latch depicted in FIG. 4A, and the software tool automatically extracts every relevant object (including every reciprocal component, device, layer, net, etc.) for purposes of analysis; the tool then performs the pertinent calculations and permits the designer to "drill down" (e.g., select or filter down circuit hierarchy) to the desired level of detail. In another embodiment, the designer in advance selects each individual object that is to be matched or quantified, for example, by selecting a portion of a circuit representation in a graphical user interface (GUI), and the system then performs affected processing. Per numeral 115, the pertinent matching evaluation parameter or parameters is (are) then calculated; depending on parameter and embodiment, each matching evaluation parameter can simply be a difference value for the design characteristics which have been measured for the reciprocal nets, and it can be based upon any suitable design characteristic (e.g., RC delay, total resistance, total capacitance, impulse response, a signal delay time, a transfer function, a channel bandwidth, a voltage drop, a current density, transient characteristics, and potentially many other types of circuit performance parameters/desired characteristics). It can also be based on a difference value that accounts for any desired or intended relationship (e.g., weighting) between the supposedly matched structures. For example, in some designs, characteristics (such as capacitances, or resistances) should ideally have values that are multiples (e.g., 2, 4, 8, etc., or any other binary or non-binary scaling) of a common "unit value." Examples of designs where weighting is very popular include SAR ADCs (successive approximation register analog to digital converters), which use a binary weighted capacitor array within a digital to analog converter), and current steering digital to analog converters, where currents in different current sources are typically weighted by some factor of 2. It is also contemplated that some embodiments will account for variation in one or more of these characteristics, for example, representing temperature variation, frequency variation, process corners, or other variables, statistically-based or otherwise.

Other figures of merit, besides a simple difference value between calculated, simulated or modeled design characteristics, can also be used (e.g., statistical measures). As also indicate by function block 115, each calculated matching evaluation parameter can then be compared to one or more thresholds, with validation of matching (or failure of matching), 117, predicated upon desired criteria (e.g., these criteria can be expressed using Boolean logic 118, for example, requiring that a number of criteria all be met in parallel, or in a manner that permits certain alternative parameters to be satisfied).

As should be apparent from the foregoing, the described tool provides for a significant improvement in EDA tool operation, by providing for automated matched circuit evaluation by extracting parasitics, using those parasitics to evaluate one or more criteria in parallel for reciprocal matched objects, and comparing matching evaluation criteria (simulated/calculated/modeled using extracted parasitics, where those parasitics are selected/extracted based on the particular criterion), directly in the EDA tool. Assisted by suitable rendering, such as graphical rendering techniques introduced earlier (e.g., color-based rendering techniques), these improvements provide for more efficient integration circuit design process using EDA tools.

FIG. 2 is a block diagram showing another embodiment 201 of techniques for matched object analysis based on parasitics. As before, the software tool, method and/or system operates on parasitics data 203, for example, as extracted from a circuit layout file (and/or associated design files 205) by an extraction tool or module. Optionally, this parasitics' data is already expressed using a standard post-layout netlist file format, for example, DSPF, SPF OAEV, SPEF, SPICE, HSPICE and/or other formats, per numeral 207. As collectively represented by numeral 208 in FIG. 2, a designer can be prompted by software to specify a given circuit design (e.g., a specific post-layout netlist file), identification (if needed) of any matched cells or circuits to be evaluated (211), and any suitable circuit design characteristics that are to be measured/calculated/simulated (i.e., and associated matching evaluation parameters that are to be gauged, per numeral 213). For example, in one embodiment, the designer can be called upon to specify each of (1) a name or a path to post-layout netlist, (2) names of two or more nets or objects that need to be verified for matching, (3) names of reference points—usually ports or device instance pins—that are start points for resistance and delay calculations, (4) specified matching criteria (e.g., design characteristics to be compared, tolerances (absolute and/or relative values), etc., and (5) a filtering setup, e.g., to determine which characteristics need to be excluded from comparison (for example, small coupling capacitances or small resistance values that might have no significant impact on electrical results). For example, these items can be entered via a workstation or other processor-based device having one or more conventional user-interfaces, such as touch-screen, display screen, keyboard, mouse (or other cursor-control device), microphone, or other input device, as pictorially-represented by computer icon 209. This type of manual specification is not required for all embodiments, and parameters can be specified or inferred in many different manners depending on tool design, e.g., in some embodiments, these specifications and parameters can be automatically inferred based on prior designer actions and/or the current state of software, and/or cell or circuit type. As an example, per numeral 212, in one embodiment, a matched circuit type can be identified as part of a standard cell definition or inferred from such a definition, and used to automatically trigger matching analysis pursuant to the techniques identified herein. These various inputs and/or definitions can optionally be used to select and retrieve an index file into RAM, created as represented above (or to create such an index and associated binary file, as discussed above), and to load only those portions of the binary file needed for parasitics' sensitivity analysis into RAM. Per numeral 215, the method/tool then proceeds to perform calculate/simulate/model the same circuit design characteristics, in the same way, for each supposedly-matched object. As indicated by numeral 217, the method/tool for each reciprocal object processes parasitics for one or more design characteristics of interest by selecting parasitics from the netlist file which are pertinent to the particular design characteristic being considered; for example, if the pertinent design characteristic being computed/simulated/modeled is total resistance, the method identifies and uses parasitics for the pertinent, reciprocal objects which are resistance-based. Similarly, if the pertinent design characteristic involves RC delay, the method/tool selects parasitics for the pertinent, reciprocal objects which represent capacitances and/or resistances. As denoted by numeral 219, in one embodiment, parasitics which are extracted and processed can include resistances ("R"), capacitances ("C"), self-inductances ("L") and/or mutual inductances ("K") expressed in any desired units (or in a unit-less manner, if appropriate). For example, units of measure which include Ohms, Farads, Henries and/or other types of units can be assumed as a default, depending on parasitics' type.

The system/tool then calculates the various electrical characteristics for each reciprocal object to be compared. For example, per numeral 221, coupling capacitances from each of object of a reciprocal set of objects can be calculated by a straightforward integration (summation) of all individual coupling capacitances between affected objects. Per numeral 223, resistances can be calculated by a matrix solution of Kirchhoff's equations for DC current flow on a resistive network, with voltage boundary conditions applied to each starting (e.g., reference or excitation) point and to each end point (e.g., each device instance pin or observation point), one by one. In one embodiment, per numeral 225, such a solution is performed by one or more processors acting under auspices of instructional logic to perform matrix math, i.e., to calculate point-to-point resistances for each layer or polygon of interest. Per numerals 227 and 229, delay ("D") calculation may be performed according to the Elmore delay formula, or by simulating an AC response of the system and a small-signal harmonic excitation at the reference point, and by calculating a delay as an inverse of a 3 dB-bandwidth for each of the destination points (e.g., device instance pins). Per numeral 231, device instance parameters can be read directly from post-layout netlist (these parameters are extracted from the layout and calculated by a layout verification of schematic, or "LVS," system). Per numerals 233 and 235, other electrical characteristics important for circuit operation can be included into calculations—such as frequency-dependent response (transfer function, Y-parameters, S-parameters, etc.), inductance (total, loop or coupling), IR voltage drop on power/ground nets, temperature dependence of resistances and delays, variability of resistances and delays (caused by global BEOL variations), any other types of impedances, and so on. For example, matching analysis can also optionally be applied to higher-order effects, such as variability of RC parasitics caused by global process variations, or temperature dependence (temperature coefficients) for resistance, as introduced earlier.

Sometimes, a root cause of mismatch can result from non-symmetric placement with of device instances/nets with respect to well implant masks and/or other structures. Consideration of a well proximity effect is represented by numeral 236, i.e., where asymmetric placement of device instances or other structures to a well skews the fab process (e.g., results in non-evenly distributed doping, which might in turn affects electrical parameters such as threshold voltages, current densities and so forth). In one embodiment, these types of effects are quantified in the parasitics' data and/or from algorithms implemented by the tool/method, which looks at asymmetries relative to device instances and factors these asymmetries into calculation/simulation/modeling of the circuit design characteristics at issue.

Per numeral 237, once the design characteristics of interest are calculated, simulated and/or modeled for reciprocal objects of interest, these characteristics are then compared. The output of the comparison can be a flag or set of flags (e.g., for different characteristics), which are stored and/or displayed via a GUI to the designer to permit the designer to tell immediately, without necessarily looking into details, whether two (or more) objects are matched or not. Per numeral 239, the comparison can be with respect to a designer- or system-specified threshold or set of thresholds (241), to determine whether any detected asymmetry is within a pertinent tolerance level. If all flags show that matching is achieved, the job is done and no further steps might be required; in one embodiment, the tool/method can perform automated validation of the cell/design (i.e., per numeral 243) and can inform the designer of this validation. The method/tool can also be scripted to generate, if matching fails for one or more characteristics, detailed reports and/or charts (245) showing comparison results for coupling capacitances, resistances, delays, and device SPICE instance parameters. From these tables and charts, the user can see how big the differences are and whether they can be waived, and what the reasons are for the mismatch. As noted earlier, and as referenced by numeral 247, a temperature-based GUI display image or screen can also be presented and/or overlaid on a circuit representation to show the designer exactly where bottlenecks and/or mismatches are being caused; for example, colors can be used to alert the design both where the issues are and how bad the issues are (e.g., how sensitive the asymmetry is to any particular parasitic element or structural element design associated with one or more particular parasitics. The system can also run more detailed subsequent simulations, to help identify the specific root causes of the mismatch, and their locations (in X, Y, and Z dimensions) in the integration design. Per numeral 248, in some embodiments, the tool/method provides a designer with an ability to invoke a SPICE module to perform additional (e.g., more focused) simulation. In a similar manner, per numeral 249, the designer can transition to a layout (redesign) module to dynamically adjust or more elements of the integration design, for example, moving device instances, shapes, and taking other actions so as to reduce the asymmetry. As indicated by numeral 251, the integration design can then be automatically re-extracted and re-assessed using the techniques just discussed, with any design updates (including updates to the PLN file) being committed back to memory (e.g., main memory or mass storage, represented by numeral 255). The design can optionally be revalidated at any point in time, per numeral 253.

Figure 3:
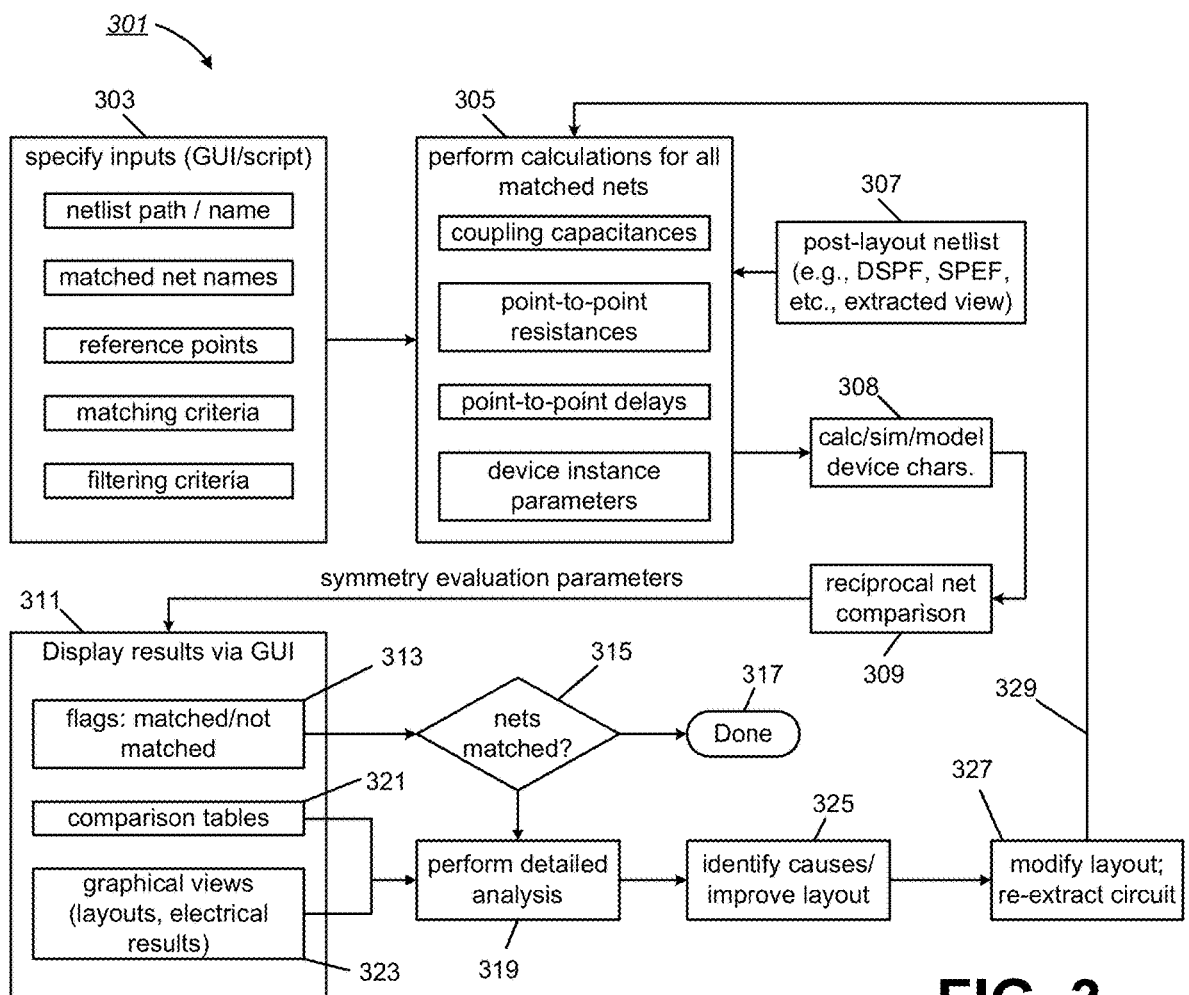
FIG. 3 is a block diagram showing another embodiment of techniques for matched object analysis based on parasitics.

FIG. 3 is a block diagram showing configuration of a software tool and/or method for matched net/device instance analysis based on parasitics; this tool/method is generally referenced by numeral 301. As indicated by function block 303, the tool includes a module or code set that accepts user inputs via a first user interface; this user interface can be a GUI (as indicated in the drawing) and it can also interact with one or more various user input devices, such as a touch screen, computer mouse, computer monitor, keypad, and/or other means for indicating or providing control or input from a designer. In connection with the depicted embodiment, and as referenced just above, a task of this code is to receive a specification of a netlist file path or name (i.e., identifying a specific integration design), a specification of one or more matched circuits (or matched objects, e.g., "$V_{out+}$" and "$V_{out-}$") a set of reference points (e.g., representing an excitation point and/or observation point for evaluating a particular design criteria), a set of matching criteria (e.g., a tolerance value against which matching is to be validated or identifies as asymmetric), and a set of filtering criteria (e.g., level of granularity at which matching and/or parasitics are to be evaluated or displayed). In some embodiments, the software tool and/or method is configured to permit the designer to highlight/select multiple options at the same time (for example, displaying multiple selected objects, filtered by multiple selective impedances, for multiple circuit design characteristics). The particular configuration of a GUI used to accept inputs (and which inputs, filters and/or simulation criteria are specified) is considered an implementation choice, well within the skill of an experienced computer programmer, and will vary depending on application. To cite an example of this, for some design tools, a matched circuit can be defined in the expression format for a standard cell, and therefore data might already be present in the specific integration design which indicates which circuits should be tested for match matching. In another example, pertinent circuit design criteria to be assessed might be inferred depending on context (i.e., dependent on where past-designer choices and current display selections, relative to the various navigation options afforded by the tool); in yet another example, a SPICE tool implementing the novel techniques of this disclosure might infer different criteria, or permit or require a different set of inputs, than a layout design tool making use of the same novel techniques.

As indicated by numeral 305, a second module or code set operates upon these various inputs to perform (a) calculation/simulation/measurement of one or more design characteristics (b) for all supposedly-matching objects for each matched circuit represented by the given integration design. As indicated in the FIG., these calculations/simulations/measurements include calculation of coupling capacitances, point-to-point resistances, and point-to-point delays, and calculation of device instance parameters and/or other electrical characteristics (as discussed above), followed by computation of the characteristics of interest for each reciprocal object, per numeral 308, and followed by reciprocal object comparison 309; the result of this processing is one or more matching evaluation parameters, as discussed earlier.

Results are then displayed to a designer, as indicated by function block 311. This act of displaying can be performed a module or code set that interacts with the designer via a user interface; the user interface can be the same interface as was referenced earlier, but this is not required for all embodiments. Results can once again be displayed to the designer via a GUI. Configuration of the display of results will vary depending on implementation. For example, in one embodiment, the designer can simply be provided with a summary screen indicating whether the design passed matching analysis and, if not which particular matched circuits caused failure. In one embodiment, for example, validation can be automatically indicated if each and every supposedly-matched circuit represented by the integration design is determined to, given the parasitics represented by the PLN file, have all circuit design characteristics (CDCs) for reciprocal objects fall within one or more specified tolerance levels (e.g., given any appropriate weighting). As indicated by numeral 313, a matching evaluation parameter MEP, (e.g., such as $MEP=k_1*CDC_{matched-object1}-k_2*CDC_{matched-object2}$) can be compared to a threshold (e.g., $MEP_i \leq Th_i$) with a flag being set for the particular matching evaluation parameter i if one or more thresholds for match are violated. Per numeral 315, matching for the entire integration design can then be assessed according to desired criteria (e.g., all matching evaluation parameters meeting their specified tolerance), using Boolean logic if desired (e.g., design meets either criteria 1 and meets criteria 3 or meets criteria 1 and criteria 2 and criteria 4). Many such examples are possible. As the examples provided above imply, typical criteria will be to require that (a) all reciprocal objects match within the specified tolerance level (i.e., $/k_1*CDC_{matched-object1,i}-k_2CDC_{matched-object2,i}/\leq Th_i$) for a given matched circuit cell for all of the matching evaluation criteria specified for that matched circuit type, and (b) that all matched circuits for the given integration design match in this manner, but this is not required for all embodiments. If the validation criteria specified for the integration design are satisfied, the method ends (per numeral 317), but if not, more detailed analysis can then be triggered (i.e., per function block 319). In one embodiment, the user-interface and associated code sets/GUI can display results in comparison tables (321), in a manner that permits a designer to readily see the results of matching evaluation, preferably being able to "drill down" into the analysis for individual objects (and especially for reciprocal objects which violated matching evaluation criteria and were determined not to match, if any). Per numeral 323, results can also be rendered into some type of graphical display; optionally, results can be overlaid onto circuit layouts or 3D representations of structural elements. For example, as discussed previously, in once embodiment, color displays can be generate which permit a designer to see which objects of a given matched circuit are causing failure (i.e., which structures or parasitics are giving rise to a problem) and how sensitive the particular design characteristic, and associated matching evaluation parameter, are to that object or individual parasitic element. Per numeral 325, displays of this type permit a designer to identify root causes of asymmetry in matched circuits, and to provide remediation, such as by improving the layout. In one embodiment, the described techniques can be integrated with a layout editor. A designer based on the displayed results (311) can modify the layout as needed, with a modified circuit then being re-extracted and again measured for matching (i.e., as indicated by feedback arrow 329). In one embodiment, this is all performed in real-time, with a designer committing/approving manually-entered or automated changes to structural elements in the extracted design, and with parasitics data being automatically regenerated to account for the change, with dynamic design changes being saved to memory. As before, many options and configurations are possible for remediating detected issues.

Figure 4B:
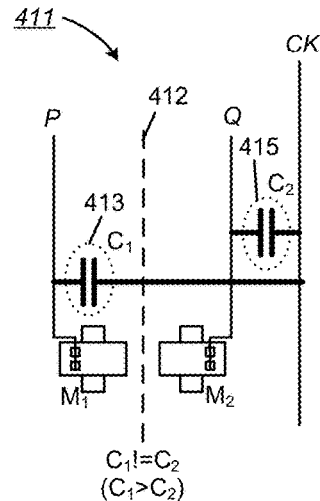
FIG. 4B is a layout illustration which shows illustrating hypothetical asymmetric capacitive coupling between purportedly matched paths (nets) of the strongarm latch of FIG. 4A.
Figure 4C:
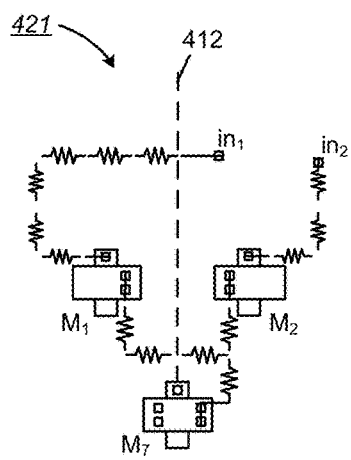
FIG. 4C is another layout illustration showing hypothetical asymmetry in resistances of supposedly-matched objects from FIG. 4A, which might for example cause asymmetric voltage effects/offsets or contribute to asymmetric signal delays.
Figure 4D:
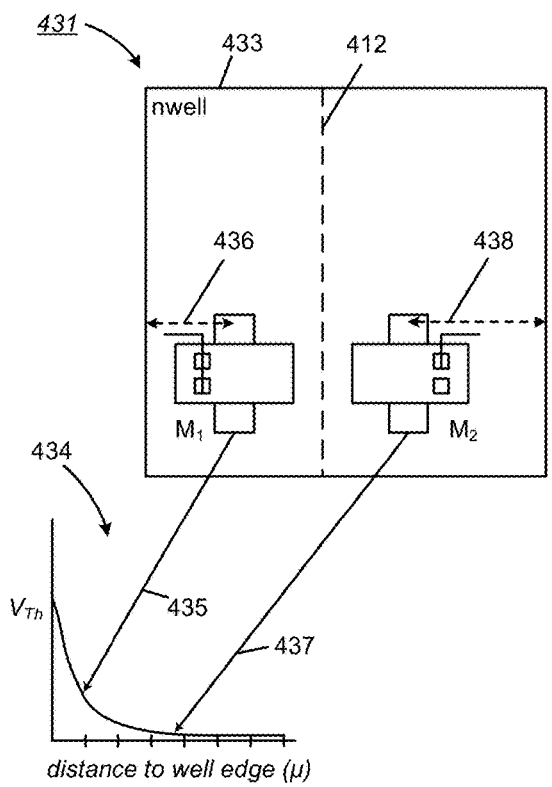
FIG. 4D is another layout illustration showing hypothetical device instance asymmetry (i.e., asymmetry in supposedly-matched transistors), created by different gate thresholds, caused in turn by well proximity effect (i.e., proximity to "nwell," element 433).

FIG. 4A is a schematic illustrating configuration of a "strongarm" latch, and FIGS. 4B-4D are used to illustrate various types of unintended asymmetries in a supposedly matched circuit and how they can be addressed using the novel techniques provided herein. As noted earlier, there are many types of matched circuits and many types of matched paths in integrated circuits designs; some designs rely implement a push-pull design (e.g., circuitry within a differential transmitter), while other designs rely on establishing a race-condition in reciprocal paths. While many of these designs feature only two reciprocal structures (e.g., the left and right halves respectively of the strongarm latch depicted in FIG. 4A), there are designs that feature three or more reciprocal paths that are to be compared for matching. A strongarm latch is used here simply for purposes of explaining problems associated with matching, and how the techniques presented herein can help assist matching verification and/or remediation in an EDA tool. It should be understood that the concepts provided in this disclosure can be extended to any type of matched circuit or matched object verification, regardless of whether the particular integration design involves a strongarm latch. It should also be understood that in a typical application, there may be hundreds or even thousands of matched circuits in a given integration design, e.g., a contemplated application of the techniques disclosed herein is to an EDA tool that provides matching verification of a single matched circuit and/or matching verification of every matched circuit (e.g., of potentially thousands present), automatically, and in real time, in a LSI or VLSI design. Finally, it should be understood that for each matched circuit, there may be dozens of reciprocal objects that are to be compared as part of matching analysis, e.g., different nets, subnets, and permutations of components within a matched circuit, with the particular circuit design characteristics which are being evaluated for matching varying according to type of structure, application and the preferences of the designer.

The strongarm latch of FIG. 4A might be used as a sense amplifier, a comparator, a latch, or to another end depending on the particular integrated design at issue. The operation of the circuit will be first described followed by a narration of how uncorrected matching problems might create issues. Operation of the circuit is best understood by noting that there are two inputs, labeled "$V_{in1}$" and "$V_{in2}$", a toggling clock signal "CK", and a differential output $V_{out}$ (with two terminals which are respectively labeled "+" and "−"). For purposes of discussion, it will be assumed that $V_{DD}$ is always at 5.0 volts DC ("high") and that the ground connection is always at 0.0 volts DC ("low"), that the clock signal transitions between these two voltages with a periodic frequency and, further, that each depicted transistor will have a voltage drop equal to 0.7 volts DC. When the clock signal goes low, this precharges both of the "+" and "−" terminals of $V_{out}$, such that they have equal outputs. When the clock signal goes high, this isolates the charged terminals "+" and "−" of $V_{out}$ and permits transistors $M_1$ and $M_2$ to turn "on," and to draw a differential current according to whether "$V_{in1}$" or "$V_{in2}$" is larger. If "$V_{in1}$">"$V_{in2}$", then in theory, the "+" terminal of $V_{out}$ will settle to high (5.0 VDC), while the "−" terminal of $V_{out}$ will settle to low (0.0 VDC), whereas if "$V_{in1}$"<"$V_{in2}$", then in theory, the "−" terminal of $V_{out}$ will settle to high (5.0 VDC), while the "+" terminal of $V_{out}$ will settle to low (0.0 VDC). The depicted strongarm latch thus acts as a comparator that generates a differential logic "1" ($V_{out+}$−$V_{out-}$=+5.0 VDC) if "$V_{in1}$">"$V_{in2}$", or a differential logic "0" ($V_{out+}$−$V_{out-}$=−5.0 VDC) if "$V_{in2}$">"$V_{in1}$". However, this discussion assumes ideal operation of the depicted latch in terms of matching between left and right halves of the latch. If for example the threshold voltage of transistor $M_1$ is different than the threshold voltage of transistor $M_2$, it is possible that the wrong logic state might be reported at the output (e.g., a differential logic "1" under some cases where "$V_{in2}$">"$V_{in1}$"). This hypothetical represents just one type of unintended asymmetry. If given the way the strongarm latch is laid out in an integration design, the path from "$V_{out+}$" to point P is longer than the path from "$V_{out-}$" to point Q, this can similarly create asymmetry issues. Many other types of asymmetry issues are possible depending on different ways components might be laid out. To evaluate these possible asymmetries, the techniques disclosed herein might be applied to perform different types of matching analysis on various subsets of nets or other objects associated with the left and right halves of the strongarm latch depicted by FIG. 4A.

FIG. 4B shows one type of problem that can be created during the integration design and/or layout process; FIG. 4B shows a layout depiction 411 that is simplified to show transistors $M_1$ and $M_2$, their connections to respective points P and Q, and a hypothetical routing for the signal CK; dashed line 412 represents a point of matching for the strongarm latch (e.g., in some cases, this will be a symmetry line for the depicted structures). As depicted in this FIG., a trace for clock signal CK is non-symmetric relative to signal traces for the reciprocal paths (reciprocal nets) {P→$M_1$} and {Q→$M_2$}; this in turn causes a different coupling capacitance between a layer for signal CK and each of nets {P→$M_1$} and {Q→$M_2$}, respectively. For example, as depicted by the FIG., a coupling capacitance $C_2$ (also represented by numeral 415) between the metal layer for signal CK and net {Q→$M_2$} is greater than a coupling capacitance $C_1$ (also represented by numeral 413) between the metal layer for signal CK and net {P→$M_1$}. Depending on how severe this differential is and the specification requirements for the strongarm latch of FIG. 4A, this might affect the proper circuit operation. To address this, the techniques introduced above might be applied to compute and compare coupling capacitance for each of reciprocal nets {P→$M_1$} and {Q→$M_2$}, and to graphically represent issues to a designer in a manner that permits the designer to immediately recognize issues, notwithstanding potentially many other circuit structures present. Other design characteristics can also or instead be computed, e.g., a measurement of RC delay would be based on coupling capacitance, and therefore a symmetrical evaluation of RC delay for each of these objects might also reveal a matching issue. A software tool or designer can specify matching tolerance criteria, such as coupling capacitance difference<X and total coupling capacitance<Y and total RC delay<Z for matching validation, with the tool being scripted to automatically verify matching based on the specified criteria.

FIG. 4C is another layout illustration 421 showing hypothetical asymmetric resistances of supposedly-resistance-matched objects from FIG. 4A, which might for example cause asymmetric voltage effects/offsets or contribute to asymmetric signal delays. This FIG. shows a layout depiction in which portions of metal layers have been broken into individual parasitic resistances, representing unintended resistive effects from the non-ideal behavior of metal layers, vias and connections. As depicted in this FIG. the routing—and associated parasitic resistances—are non-symmetric, with a path passing through transistor $M_1$ presenting a greater effective resistance than a path passing through transistor $M_2$. Once again, depending on tolerances for the particular matched circuit (which in turn might depend on intended application of the integration design), this asymmetry might cause issues. Circuit design parameters that might be measured of supposedly-reciprocal objects {in1→$M_7$} and {in2→$M_7$} which might depend on these resistances might be total resistance for the object, RC delay, and other parameters. A hypothetical matching evaluation parameter might compare the total resistance (or RC delay) for the depicted reciprocal objects to obtain a difference value, with this difference value then being compared to a threshold to determine whether the differential is within tolerance. Once again, if any calculated matching parameters violate the specified thresholds (i.e., representing mismatch), this can automatically trigger the tool to present displays that permit the designer to visualize exactly the source of the problem.

FIG. 4D is another layout illustration showing hypothetical device asymmetry (i.e., asymmetric in supposedly-matched transistors), created by different gate thresholds, caused in turn by well proximity effect (i.e., proximity to "nwell," element 433, which is seen to overlay, e.g., be asymmetrically placed above or below two transistors). More specifically, the presence of a hypothetical well (433) is depicted to the left of a symmetry line 412 and this well is therefore closer to transistor $M_1$ than transistor $M_2$. As seen in a graph 434 (of how transistor gate voltage threshold varies as a function of distance to well, in microns), this difference in positioning can cause the supposedly-identical device instances for transistors $M_1$ and $M_2$ to have different dopant concentrations (material properties) and therefore different gate thresholds. For example, transistor $M_1$ is seen to map (435) to a higher gate voltage threshold than a mapping (437) of transistor $M_2$, and with corresponding first and second distance arrows 436 and 438 indicating that transistor $M_1$ is closer to a well edge than the second transistor $M_2$. In the embodiments depicted above, device instance information is collected and combined with the parasitics information to detect this well effect, to quantify it in terms of gate threshold and/or effective resistance, and to potentially identify this as a matching issue. For example, as noted earlier, effective resistance is computed in some embodiments by solving Kirchhoff's current flow equations for total resistance given certain voltage and/or current flow boundary conditions.

Note that these examples depict some relatively simple analyses for a very small number of reciprocal objects. Returning to the example presented by FIG. 4A, there are many reciprocal objects represented by the FIG., including matched transistor pairs $M_{1/2}$, $M_{3/4}$, $M_{5/6}$, and numerous layers, vias and traces, any of which might have an impact on circuit operation; in other words, a large number of reciprocal objects might be evaluated with using a large number of matching evaluation criteria, even for a relatively simple standard cell (such as the strongarm latch of FIG. 4A). With the techniques introduced herein, a software design and/or analysis tool is designed to perform this type of matching evaluation automatically, with a designer optionally manually specifying thresholds for matching evaluation in view of the particular application. The techniques presented herein provide a mechanism for a design to identify matching errors at an early stage in the layout and/or validation process, and so, provides for an improvement in EDA tool operation and for more efficient integration design.

Figures 5A, 5B:
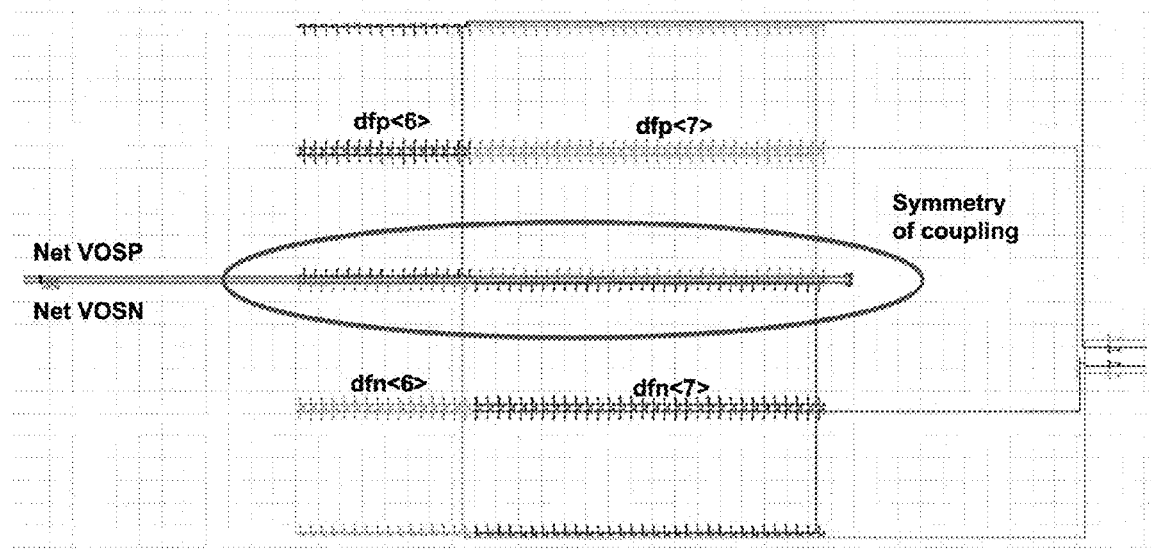
FIG. 5A is a graphical user interface (GUI)-rendered comparison table illustrating coupling capacitances and other characteristics of two nominally-matched objects.
FIG. 5B is a graphical representation of victim matching nets (VOSN and VOSP) and aggressor nets which capacitively couple to the victim nets.

FIGS. 5A and 5B are used to illustrate some types of display options that can be presented to a designer. More particularly, FIG. 5A shows a table listing that a designer might use to assess proper matching of reciprocal while FIG. 5B shows a color-based display with colors representing circuit structures and overlaid on those structures so as to help visualize asymmetry.

More particularly, FIG. 5A represents a view of capacitive coupling comparison for various reciprocal nets (objects) "VOSN" and "VOSP" of a matched circuit. Each row represents a different capacitive coupling aggressor to these nets, while the depicted columns include an aggressor index (ID), a measure of coupling capacitance by the aggressor to the first reciprocal net (VOSN), a capacitive coupling percentage (representing the extent to which the particular net-to-net parasitic contributes to total capacitive coupling for the object being assessed, VOSN), a measure of coupling capacitance by the aggressor to the second reciprocal net (VOSP), a capacitive coupling percentage (representing the extent to which the particular net-to-net parasitic contributes to total capacitive coupling for the object being assessed, VOSP), a first differential value (net2−net1), a second differential value (net2−net1) and a flag indicating whether one or both differential values violates tolerance criteria for matching. In this particular case, a "1" in the last column is used to denote that matching criteria are satisfied (the particular capacitive coupling value is sufficiently matched for the two nets, VOSN and VOSP) and a "−1" indicates that matching criteria is violated, i.e., that the pertinent matching evaluation parameter is outside acceptable tolerance. A GUI display of this type can be generated and displayed or stored in memory for later use. A designer can also select any given item (e.g., row 10) and by clicking on that item, potentially drilling down if desired to lower level parasitics' analysis to see which contributing nets are causing the most significant matching issues.

In another implementation, a GUI can use highlighting or "temperature" to provide a visualization that permits a designer to obtain a prioritized view of reciprocal objects and immediately hone in on which objects are creating the biggest bottlenecks to matching. FIG. 5B for example shows a color-based display with colors used to differentiate nets. For example, FIG. 5B might indicate that nets dfp<7> and dfn<7> (which in theory should matched) have different path lengths on the right-hand side of the figure, and consequently, different capacitive coupling to nets dfp<6> and dfn<6>. In optional embodiments, color can also be used to indicate magnitude of asymmetry (or matching violation), or can be used in more detailed figures or views to represent parasitics and/or associated structures. A colored display of the type indicated (or another "temperature"-based display) permits a designer to immediately understand where the greatest asymmetry issues/bottlenecks might lie, again, rooted to the parasitics and device instances provided by the post-layout netlist file.

FIGS. 6A-7C are used to further illustrate some of the display generation and rendering options that can be provided by a suitably designed software tool.

As noted earlier, the ability of the designer to visualize the positioning of parasitics and/or structural elements in a given layout and the relationship to asymmetry can be invaluable to identifying and correcting issues in a design. The techniques disclosed herein provide mechanisms which permit a designer to do that in a manner previously not possible. In some embodiments, therefore, the described computer-implemented methods and apparatuses (e.g., instructions on non-transitory machine-readable media) further combine parasitics' sensitivities into a graphical representation of the particular path of interest (e.g., of the physical structures with contribute to parasitics affecting a given circuit design characteristic at observation point(s)).

FIG. 6A for example shows a 2D graphical depiction 601 of physical structures that make up a hypothetical circuit, rendered in a manner that graphically depicts sensitivity of the circuit design characteristic of interest (e.g., "RC delay") to each one of the depicted structural elements. For example, each layer/structure considered by the analysis is seen as drawn as a respective polygon, representing a trace or path (or portion thereof) modeled as a different parasitic element. The sensitivity of the circuit design characteristic of interest (in this case, RC delay) to the individual parasitic is colored (i.e., emphasized) in a way that permits a designer to immediately see where bottlenecks might arise for an object represented by the specified excitation and observation points. For example, in this particular case, as indicated by a legend in the lower-right corner of the FIG., polygons with a dark (thick) outer line (e.g., structure 613) have a greater proportionate influence on overall RC delay for the specific points, while structures with a thin outer line and simple hatching (e.g., structure 603) contribute least to the overall RC delay of the specified points. A designer concerned with the aggregate RC delay for the depicted structures might choose to focus on adjusting the layers/structures depicted the dark and thick outer lines as having the greatest immediate impact in reducing overall RC delay to desired maximums. As seen in this FIG., and given the indicated shading, structure 613 has a greater impact on overall RC delay than structure 611, which has a greater impact than structure 609, which has a greater impact than structure 607, and so on, continuing with structures 605 and 603. Note that "color" is used in this sense to refer to any manner of denoting relative importance emphasis, but it is also possible to use visual colors or other mechanisms to differentiate sensitivity values; for example, as noted above, colors such as "red," "green," and "blue" can be used in lieu of shading or cross-hatching to indicate emphasis, with red colors used to indicate relatively high sensitivity, meaning that adjustment of associated parasitics/structures will have the greatest incremental impact on adjusting/varying the circuit design characteristic being simulated/calculated modeled, while adjustment of blue (and to a lesser extent, green) structures will have a much less significant impact. Sensitivity weighting (such as color or other emphasis) can be presented/overlaid with graphical representations of parasitics and/or structural elements using other mechanisms, such as by displaying a sensitivity value each time a cursor is moved over a given structural element, and so forth. In one specifically-contemplated implementation, the highest sensitivities can be exhibited in dark red (e.g., structure 613), with light red being used for structure 611, orange for structure 609, dark green for structure 607, light green for structure 605, and blue for structure 603, and so on. Many different variations and means for graphically differentiating sensitivities will occur to those having ordinary skill in the art. As this discussion implies, in one embodiment, software generates (renders) a graphical representation of the actual layout of the given electronic circuit design, with sensitivities overlaid onto individual structures as appropriate.

Note that software can incorporate a wide range of designer preferences through the use of appropriate user filtering tools. For example, returning to FIG. 6A, a given designer might wish to visualize only sensitivities to parasitics exceeding a certain threshold, and so might use an appropriate button input (e.g., a slider) to change how structures are highlighted or which structures are highlighted (e.g., only structures where sensitivities exceed a designer-provided constraint).

FIG. 6B shows a 3D graphical depiction 621, with individual structural elements graphically rendered in a manner that directly overlays sensitivity of a circuit design characteristic of interest (e.g., RC delay) onto to individual structural elements. Note that extraction software typically models a single layer as potentially many parasitic elements (e.g., substructures), depending on how that layer is configured and its interrelation to other nets, and potentially other factors. For example, layers 623 and 627 are seen as broken up into three separate structures (e.g., three substructures 623', 623" and 623''', and 627', 627" and 627'''), while layers 623 and 625 are seen as broken into two substructures (623', 623", 625' and 625"). A designer employing such a 3D visualization mechanism, for example, can individually visualize the 3D layout of individual substructures and how those substructures individually affect performance of the overall structure in terms of the specified circuit design characteristic. For example, a designer looking at the depiction 621 might immediately conclude that substructures 623' and 627" provide the greatest contribution to RC delay of the depicted structure, with parasitic $C_{623'\text{-}627''}$ dominating overall RC delay, and with depicted parasitics $C_{622\text{-}627'}$, $C_{623'\text{-}627''}$, $C_{625'\text{-}627'''}$, and $C_{625'\text{-}627'}$ contributing to a lesser extent to the overall RC delay. Again, the depicted highlighting scheme used to emphasize different sensitivities to the various parasitics (i.e., shading) is considered a design option, and a true colorization scheme (e.g., "red" versus "green" or other colors) can be optionally used in some embodiments.

As should be immediately apparent, the described visualization techniques provide a designer with different capabilities depending on objective. For example, the scheme depicted in FIGS. 6A and 6B can be used in concert with layout software (or layout adjustment software) to move individual traces in real time, and commit those adjustments back to the original design, on a dynamic, potentially real-time basis. A designer presented with the screenshot 621, for example, could in theory re-dimension or reposition structure 627 (or just substructure 627") so as to substantially reduce the greatest sensitivity to parasitics; for example, as a design moves structure 627 (627', 627", 627''') so as to be further away from structure/layer 623 (623', 623"), software can re-extract a modified design, recompute sensitivities (as appropriate) and change the presented coloring to indicate lower sensitivity of the circuit design characteristic for the overall path on any of the depicted sensitivities. Employed in the context of more sophisticated filters (e.g., no "coloring used" unless aggregate RC delay for the path satisfies a minimum threshold), these techniques present a powerful tool for identifying and resolving bottlenecks and other issues in real time. For example, with suitable software architecture, a designer could move structure 627 (substructures 627', 627", 627''') and see not only a red color transition to orange or blue, indicating reduced sensitivity to the physical properties associated with these structures (e.g., and their associated parasitics), but might sell all coloring disappear as such movement reduces overall RC delay to a point where design constraints are no longer being violated. Obviously, much more sophisticated processes can be applied as a matter of design discretion. What should be apparent is that by processing parasitics in the manner indicated, by performing specific processing to model/simulate/test a circuit design characteristic for a desired path, and by then computing sensitivity each constituent parasitic/structural element contributing to the computed value for the circuit design characteristic, a circuit design and/or analysis system can provide greatly improved capabilities of rapidly identifying and dynamically resolving issues, such as performance bottlenecks.

Figure 7A:
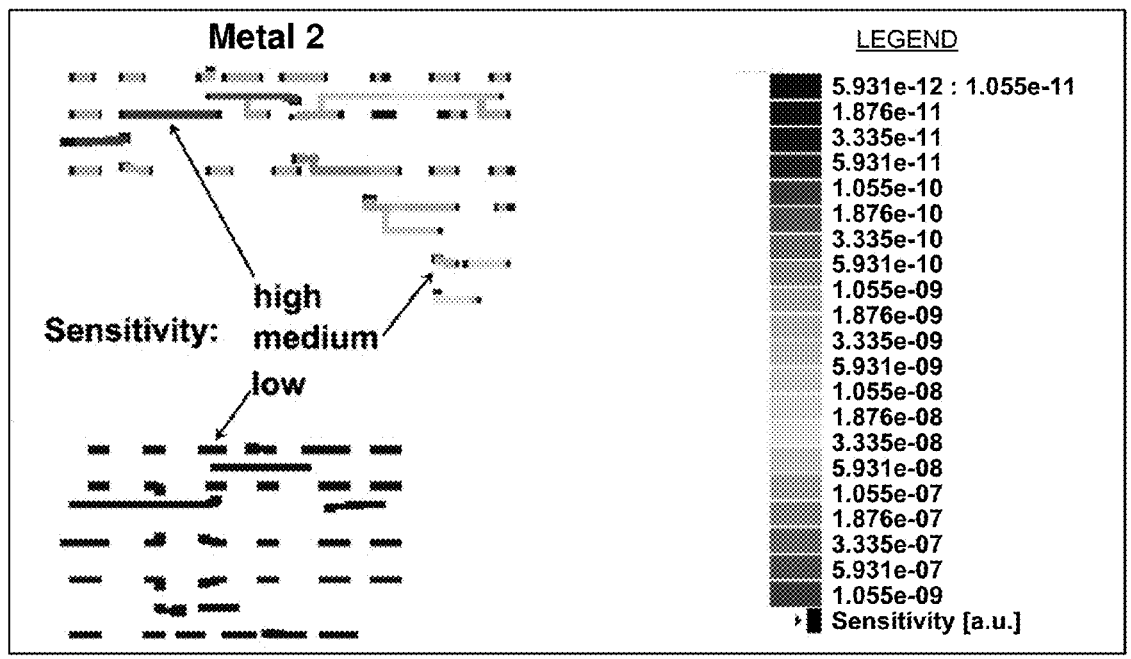
FIG. 7A is another color image of a 2D layout, in this case, where sensitivity has been filtered according to metal layer, in this case, a "metal 2" layer. Value of sensitivity of each polygon (e.g., each structural element or individual parasitic element in a given layer) is indicated by a legend seen at the right of FIG. 7A.
Figure 7B:
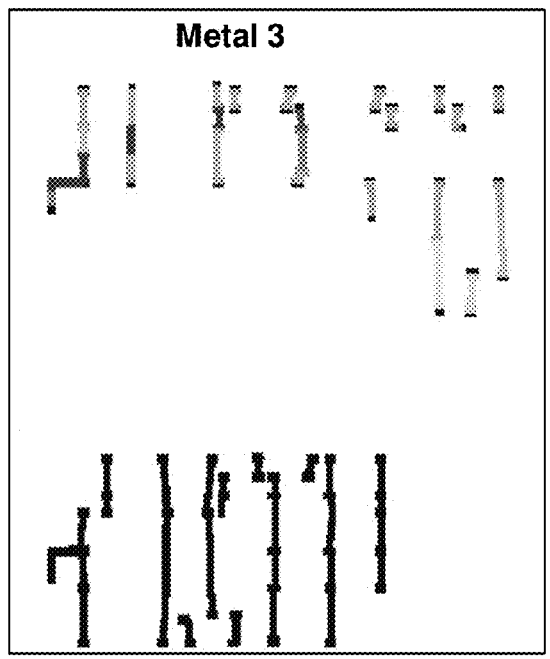
FIG. 7B is another color image of a 2D layout, in this case where sensitivity has been filtered according to different metal layer, in this case, a "metal 3" layer.
Figure 7C:
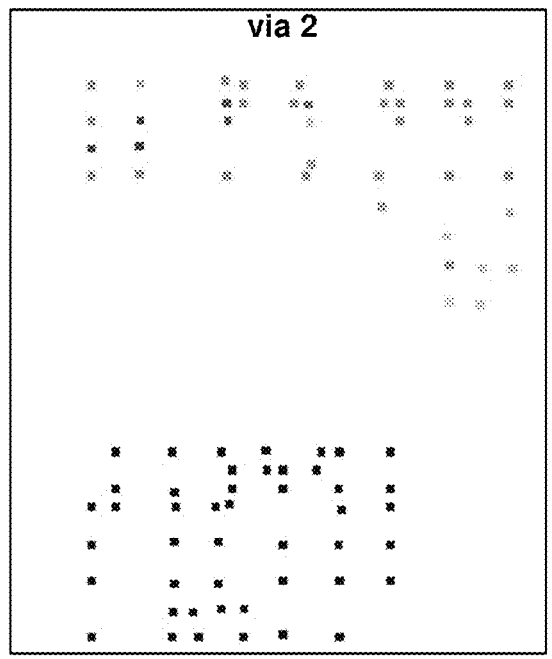
FIG. 7C is another color image of a 2D layout, in this case, where sensitivity has been filtered according to a different metal layer, in this case a "via 2" layer.

FIGS. 7A-7C show a number of different color-based visualizations based on calculated sensitivities; these figures help show that sensitivities can be grouped by layer or, indeed, any desired structural elements in any desired circuit design hierarchy, with renderings being filtered and/or switched so as to assist a designer. For example, FIG. 7A provides a screenshot 701 that once again visually colors polygons according to magnitude of calculated/measured/simulated sensitivity, in this case for a given layer only (e.g., "Metal 2"). As seen in a legend at the right-hand side of FIG. 7A, red colors represent high sensitivity magnitude (e.g., contribution by structural elements to the circuit design characteristic of interest, e.g., overall RC delay), while sky blue colors represent medium sensitivity magnitude to the circuit design characteristic of interest and dark blue represents low sensitivity. As indicated by a screenshot 711 in FIG. 7B, a designer can dynamically change views to select a different layer (i.e., in this case a "Metal 3" layer), once again with the magnitude of sensitivity of the same overall RC delay characteristic depicted for polygons associated with this layer; the colors in FIG. 7B represent the same colorization scheme (and associated magnitude ranges) as identified in the legend of FIG. 7A. FIG. 7C shows a third rendering 721 that again uses the same colorization scheme, in this case for layer "via 2." A suitably-designed GUI or other rendering tool can permit a designer to quickly explore 3D layout, in this case by filtering a view to and/or switching between segmented 2D representations, so as to visualize, evaluate and/or correct a circuit design of interest, for example, by honing in on how individual structural elements in individual layers impact sensitivity of the circuit design characteristic being simulated or modeled. By providing such a visualization ability for a myriad of different such characteristics (e.g., that can be selected by a designer for simulation, such as via a drag-down list), the techniques presented by this disclosure extend the capabilities of circuit analysis tools to permit a designer to evaluate designs for a myriad of different impacts of design parasitics and help identify and correct associated design problems, e.g., especially matching problems.

Figure 8:
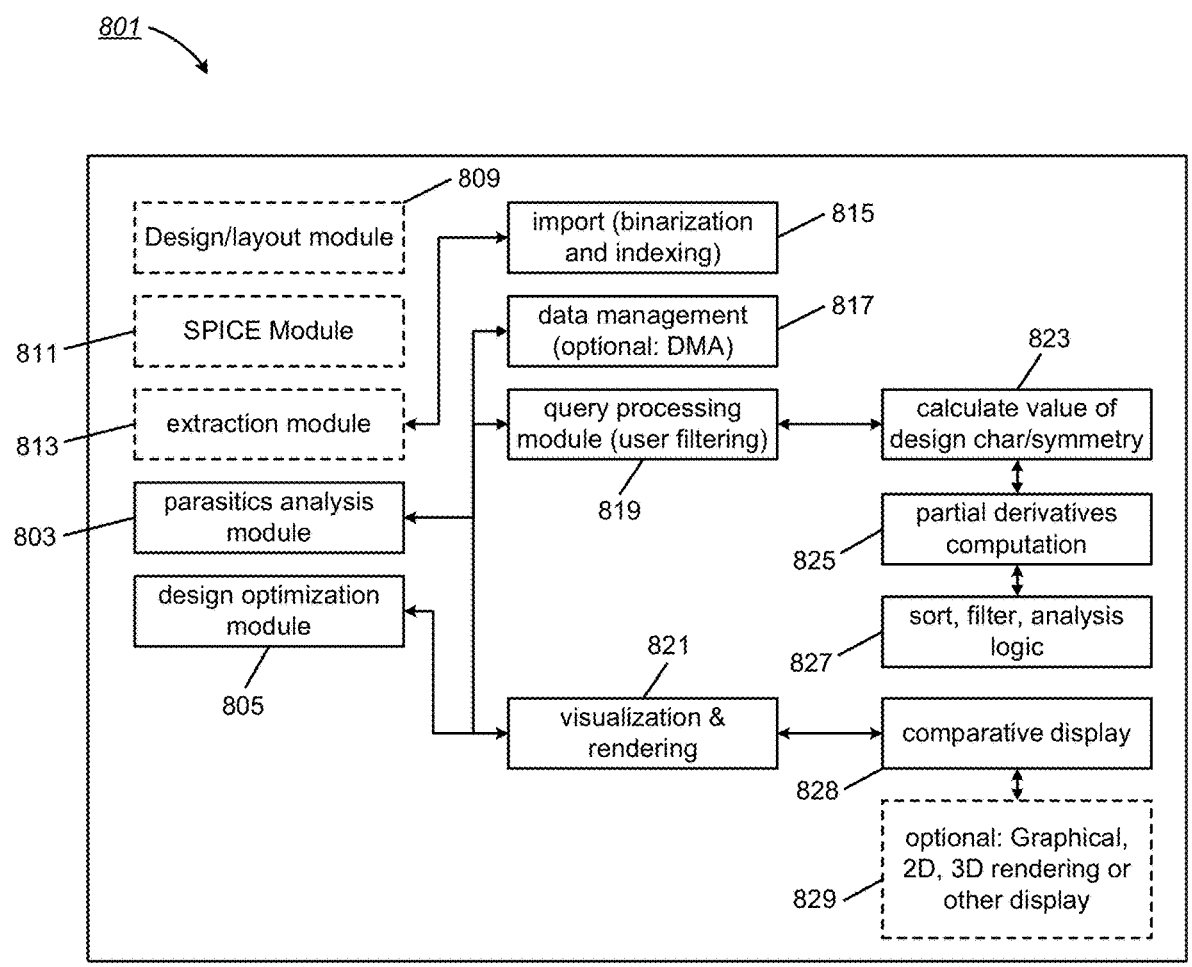
FIG. 8 is a block diagram showing one embodiment of a computer-based design tool embodying the described techniques, for example, as integrated with design/layout, SPICE and other software modules.

FIG. 8 is a block diagram showing one embodiment of a computer-based design tool 801 embodying the described techniques, for example, as integrated with design/layout, SPICE and other software modules. Such a tool can be a comprehensive software package for circuit design or analysis, for example, similar to systems sold by Cadence Design Systems, Inc., Synopsys, Inc., and other similar companies. The depicted system can include a number of different software modules depending on implementation, for example, including a parasitics' analysis module 803 and a design optimization module 805. The parasitics' analysis module 803 can operate in the manner described above for example, by providing visualization of sensitivities of one or more circuit design characteristics to individual parasitics/groups of parasitics (e.g., representing non-ideal behavior of a specific circuit structural element)—the visualization can be presented to a designer on a display screen of a computing device, e.g., via a GUI, and can take the form seen in the various FIGS., or a different form. The design optimization module 805 can provide for automated or suggested design modification, or designer-assisted design modification, by providing a mechanism for the designer to respond to indicated parasitics' sensitivities and to adjust system/structural element design. The depicted system can also include other (optional) software elements as well, for example, a design/layout module 809 (used to initially and/or manually lay out a design for a given type of electronic circuit), a simulation module (e.g., SPICE module 811), to fully simulate circuit behavior using known techniques, and an extraction module or tool 813 (i.e., to extract a netlist and/or parasitics and present them in a recognizable file format, such as in a DSPF format). In some embodiments, other file formats (e.g., SPF, SPEF, OAEV, SPICE, HSPICE) or another type of format (e.g. a custom format for representing parasitics) can be used.

As indicated by the middle and right parts of FIG. 8, the depicted system can include modules to perform various ones of the functions already discussed above in connection with other embodiments. For example, an import module 815 can receive a relatively voluminous parasitics' file and can perform "pre-digesting" of that file (e.g., of a large post-layout netlist file) to create binarized versions and associated indexes. A data manager (data management module 817) can be used to manage access to just those limited portions of the binary file needed for processing, pulling them from main memory into local memory (RAM) when and as necessary, to provide for greatly improved processing speed. A query processing module 819 permits a designer to specify parameters of interest and perform data manipulation and filtering as desired; for example, as indicated by numerals 823 and 825, this module can supply inferred or designer-selected parameters to a software routine (823) that calculates a value a circuit design characteristic and a partial derivative computation routine (825) to compute sensitivities to individual parasitics which contribute to the aggregate, as indicated earlier. The query processing module 819 interacts with the designer to permit the designer to sort, filter and analyze the computed sensitivities to parasitics as may be desired, per numeral 827. Per numeral 821, a visualization and rendering module can be used to generate desired visualizations, including spreadsheets (as discussed above) or more sophisticated renderings; for example, per numeral 828, a designer can be provided with a comparative display that indicates that reciprocal objects are not matched and which structural elements and/or parasitics are contributing most to the issues; per numeral 829, 2D and 3D sensitivity representations can be overlaid with designs or otherwise graphed or charted in a manner that provides meaningful information to the designer.

As should be apparent from the foregoing, apparatuses and method which embody the techniques described in this disclosure can provide a powerful tool for analysis and debugging of IC designs sensitive to or dominated by layout parasitics, and can greatly streamline the process of circuit layout and design optimization. Note that the described techniques provide number of advantages in terms of providing new capabilities to a circuit designer, all with substantially-enhanced speed. In addition to other advantages already discussed above, a linear solver can be used to compute/measure/model a design characteristic of interest, providing substantial advantages over techniques that rely on complex convolutions and nonlinear analysis; the techniques discussed above provide a visualization mechanism that, in some embodiments, ignores device characteristics and instead relies on boundary conditions and parasitics as inputs, that is, facilitating faster, linear analysis. By using binarization and memory management techniques, as discussed earlier, and by enabling a design to filter parasitics used for computation (i.e., potentially focusing on a small set of parasitics) and/or thresholded for display, the techniques described above permit a designer (and design tool) to quickly identify and focus on just the most significant bottlenecks, permitting identification of issues that in a manner that would typically not be identified with conventional simulation tools. By providing a tool where a designer can select different circuit design characteristics and objects to model, the present techniques provide a robust mechanism that permits a designer to quickly and easily screen for a myriad of potential circuit design issue; as these techniques are fully integratable into/with traditional platform used for circuit analysis (e.g., layout, SPICE/simulation and other EDA tools), it should be appreciated that the techniques introduced by this disclosure provide for substantial improvement in the field of EDA.

The foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement.

Various modifications and changes may be made to the embodiments presented herein without departing from the broader spirit and scope of the disclosure. Features or aspects of any of the embodiments may be applied, at least where practicable, in combination with any other of the embodiments or in place of counterpart features or aspects thereof. Accordingly, the features of the various embodiments are not intended to be exclusive relative to one another, and the specification and drawings are to be regarded in an illustrative rather than a restrictive sense.

I claim:

1. A processor-implemented method, comprising:
   identifying a first set of one or more structures represented by a given integration design and a second set of one or more structures represented by the given integration design;
   receiving digital values from a post-layout netlist file, wherein the digital values represent respective parasitic elements of the given integration design;
   calculating sensitivity of a performance parameter to at least one of the parasitic elements associated with behavior of the performance parameter for the first set of one or more structures;
   calculating sensitivity of the performance parameter to at least one of the parasitic elements associated with behavior of the performance parameter for the second set of one or more structures; and
   causing display on a user interface device of an image formatted in dependence on the calculated sensitivity of the performance parameter to the at least one of the parasitic elements associated with behavior of the performance parameter for the first set of one or more structures and in dependence on the calculated sensitivity of the performance parameter to at least one of the parasitic elements associated with behavior of the performance parameter for the second set of one or more structures.

2. The processor-implemented method of claim 1, wherein causing the display comprises:
   generating a view representing layout of the given electronic circuit design; and
   visually emphasizing in the image one or more structures of the first set represented in the view relative to one or more structures of the second set represented in the view in a manner dependent on the calculated sensitivities.

3. The processor-implemented method of claim 2, wherein visually emphasizing comprises assigning a first color to the one or more structures of the first set and a second color to the one or more structures of the second set, the first color dependent on sensitivity of the performance parameter to the at least one of the parasitic elements associated with the behavior of the performance parameter for the first set of one or more structures and the second color dependent on sensitivity of the performance parameter to the at least one of the parasitic elements associated with the behavior of the performance parameter for the second set of one or more structures, and causing the user interface device to render the image in a manner having both of the first color and the second color.

4. The processor-implemented method of claim 1, wherein the post-layout netlist file is embodied in a file format compatible with one of the Detailed Standard Parasitic Format (DSPF), the Standard Parasitic Exchange Format (SPEF) or an Open Access (OA) extracted view format.

5. The processor-implemented method of claim 1, wherein:
   the processor-implemented method further comprises generating a list of structures represented by the given electronic circuit design, including at least one structure of the first set and at least one structure of the second set;
   the processor-implemented method further comprises causing at least one processor to rank ones of the structures represented by the list relative to one another dependent on the calculated sensitivities; and
   causing the display further comprises rendering the image in a manner that conveys the ranking to a user.

6. The processor-implemented method of claim 5, wherein the structures represent at least one of respective layers and respective polygons.

7. The processor-implemented method of claim 1, wherein:
   the processor-implemented method further comprises converting the post-layout netlist file to a binary format, storing the binary format in a main memory, and creating an index to the binary format;
   receiving the digital values comprises identifying one or more locations of specific digital values which are relevant to calculation of each of the performance parameter for the first set of one or more structures and the performance parameter for the second set of one or more structures, in a user-specified subset of the given electronic circuit design, from the index within the binary format, and loading a non-exhaustive subset of the binary format corresponding to the one or more locations from the main memory to a local memory; and
   the method further comprises calculating the sensitivities from the non-exhaustive subset of the binary format which was loaded into local memory.

8. The processor-implemented method of claim 1, wherein:
   the processor-implemented method further comprises receiving a user-input representing dynamic adjustment in a physical characteristic of one or more structural elements represented by the given electronic circuit design,
   identifying change in one or more of the digital values where said change is associated with the dynamic adjustment in the physical characteristic, and
   calculating a change in at least one of (i) the sensitivity of the performance parameter to the at least one of the parasitic elements associated with behavior of the performance parameter for the first set of one or more structures and (ii) the sensitivity of the performance parameter to at least one of the parasitic elements associated with behavior of the performance parameter for the second set of one or more structures, dependent the change in the one or more of the digital values; and causing the display comprises causing at least one processor to create a graphical representation for presentation to the user via the user interface device, and change a rendering of the graphical representation in a manner dependent on the calculated change.

9. The processor-implemented method of claim 1, wherein the parasitic elements each comprise at least one of a resistance, a capacitance, a self-inductance or a mutual inductance.

10. The processor-implemented method of claim 1, wherein the first set of one or more structures and the second set of one or more structures correspond to respective, matched objects in the given integration design.

11. The processor-implemented method of claim 10, wherein causing the display comprises:

generating a view representing layout of the given electronic circuit design; and visually emphasizing in the image a first one of the respective, matched objects relative to a second one of the respective, matched objects in a manner dependent on the calculated sensitivities.

12. The processor-implemented method of claim 11, wherein visually emphasizing comprises assigning a first color to at least part of the first one of the respective, matched objects and assigning a second color to at least part of the second one of the respective, matched objects, and causing the user interface device to render the image in a manner having both of the first color and the second color, wherein at least one of the first color and the second color is dependent on difference between the sensitivity of the performance parameter to the at least one of the parasitic elements associated with the behavior of the performance parameter for the first set of one or more structures and the sensitivity of the performance parameter to the at least one of the parasitic elements associated with the behavior of the performance parameter for the second set of one or more structures.

13. The processor-implemented method of claim 1, wherein identifying the first set of one or more structures and identifying the second set of one or more structures comprises receiving a user-selection, made via a user interface of a computing device, selecting one or more circuit elements represented by the given integration design.

14. An apparatus comprising instructions stored on non-transitory storage media, the instructions, when executed, to cause at least one processor to:

identify a first set of one or more structures represented by a given integration design and a second set of one or more structures represented by the given integration design;

receive digital values from a post-layout netlist file, wherein the digital values represent respective parasitic elements of the given integration design;

calculate sensitivity of a performance parameter to at least one of the parasitic elements associated with behavior of the performance parameter for the first set of one or more structures;

calculate sensitivity of the performance parameter to at least one of the parasitic elements associated with behavior of the performance parameter for the second set of one or more structures; and cause display on a user interface device of an image formatted in dependence on the calculated sensitivity of the performance parameter to the at least one of the parasitic elements associated with behavior of the performance parameter for the first set of one or more structures and in dependence on the calculated sensitivity of the performance parameter to at least one of the parasitic elements associated with behavior of the performance parameter for the second set of one or more structures.

15. The apparatus of claim 14, wherein the instructions, when executed, are to cause at least one processor to:

generate a view representing layout of the given electronic circuit design; and visually emphasize in the image one or more structures of the first set which are represented by the view relative to one or more structures of the second set which are represented by the view in a manner dependent on the calculated sensitivities.

16. The apparatus of claim 15, wherein the instructions, when executed, are to cause the at least one processor to assign a first color to the one or more structures of the first set and a second color to the one or more structures of the second set, the first color dependent on sensitivity of the performance parameter to the at least one of the parasitic elements associated with the behavior of the performance parameter for the first set of one or more structures and the second color dependent on sensitivity of the performance parameter to the at least one of the parasitic elements associated with the behavior of the performance parameter for the second set of one or more structures, and to cause display of the image in a manner having both of the first color and the second color.

17. The apparatus of claim 14, wherein the post-layout netlist file is embodied in a file format compatible with one of the Detailed Standard Parasitic Format (DSPF), the Standard Parasitic Exchange Format (SPEF) or an Open Access (OA) extracted view format.

18. The apparatus of claim 14, wherein:

the instructions, when executed, are to cause the at least one processor to generate a list of structures represented by the given electronic circuit design, including at least one structure associated with the first set of one or more structures and at least one structure associated with the second set of one or more structures;

the instructions, when executed, are to cause the at least one processor to rank ones of the structures represented by the list relative to one another dependent on the calculated sensitivities; and the instructions, when executed, are to cause the at least one processor to format the image in a manner that conveys the ranking to a user.

19. The apparatus of claim 18, wherein the structures represent at least one of respective layers, and respective polygons.

20. The apparatus of claim 14, wherein the instructions, when executed, are to cause at least one processor to:

convert the post-layout netlist file to a binary format, storing the binary format in a main memory, and creating an index to the binary format;

receive the digital values comprises identifying one or more locations of specific digital values which are relevant to calculation of each of the performance parameter for the first set of one or more structures and the performance parameter for the second set of one or more structures, in a user-specified subset of the given electronic circuit design, from the index within the binary format, and load a non-exhaustive subset of the binary format corresponding to the one or more locations from the main memory to a local memory; and calculate the sensitivities from the non-exhaustive subset of the binary format which was loaded into local memory.

21. The apparatus of claim 14, wherein the instructions, when executed, are to cause at least one processor to:

receive a user-input representing dynamic adjustment in a physical characteristic of one or more structural elements represented by the given electronic circuit design, identify change in one or more of the digital values where said change is associated with the dynamic adjustment in the physical characteristic, and calculate a change in at least one of (i) the sensitivity of the performance parameter to the at least one of the parasitic elements associated with behavior of the performance parameter for the first set of one or more structures and (ii) the sensitivity of the performance parameter to at least one of the parasitic elements associated with behavior of the performance parameter for the second set of one or more structures, dependent the change in the one or more of the digital values;

create a graphical representation for presentation to the user via the display monitor; and change a rendering of the graphical representation in a manner dependent on the calculated change.

22. The apparatus of claim 14, wherein the parasitic elements each comprise at least one of a resistance, a capacitance, a self-inductance or a mutual inductance.

23. The apparatus of claim 14, wherein the first set of one or more structures and the second set of one or more structures represented by the given integration design correspond to respective, matched objects in the given integration design.

24. The apparatus of claim 23, wherein the instructions, when executed, are to cause at least one processor to:

generate a view representing layout of the given electronic circuit design; and visually emphasize in the image a first one of the respective, matched objects relative to a second one of the respective, matched objects in a manner dependent on the calculated sensitivities.

25. The apparatus of claim 24, wherein the instructions, when executed, are to cause at least one processor to assign a first color to at least part of the first one of the respective, matched objects and to assign a second color to at least part of the second one of the respective, matched objects, and to cause the user interface device to render the image in a manner having both of the first color and the second color, wherein at least one of the first color and the second color is dependent on difference between the sensitivity of the performance parameter to the at least one of the parasitic elements associated with the behavior of the performance parameter for the first set of one or more structures and the sensitivity of the performance parameter to the at least one of the parasitic elements associated with the behavior of the performance parameter for the second set of one or more structures.

26. The apparatus of claim 14, wherein the instructions, when executed, are to cause the at least one processor to identify the first set of one or more structures and the second set of one or more structures in response to receiving a user-selection, made via a user interface of a computing device, selecting one or more circuit elements represented by the given integration design.

* * * * *